(12) United States Patent
Tiwari et al.

(10) Patent No.: US 9,947,376 B2
(45) Date of Patent: *Apr. 17, 2018

(54) VERTICAL BIT VECTOR SHIFT IN MEMORY

(71) Applicant: Micron Technology, Inc., Boise, ID (US)

(72) Inventors: Sanjay Tiwari, Meridian, ID (US); Kyle B. Wheeler, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/625,543

(22) Filed: Jun. 16, 2017

(65) Prior Publication Data

US 2017/0287530 A1 Oct. 5, 2017

Related U.S. Application Data

(63) Continuation of application No. 15/057,736, filed on Mar. 1, 2016, now Pat. No. 9,697,876.

(51) Int. Cl.
*G11C 7/06* (2006.01)
*G11C 7/12* (2006.01)
*G11C 7/10* (2006.01)

(52) U.S. Cl.
CPC .............. *G11C 7/065* (2013.01); *G11C 7/10* (2013.01); *G11C 7/12* (2013.01)

(58) Field of Classification Search
CPC .............. G11C 7/065; G11C 7/12; G11C 7/10
See application file for complete search history.

(56) References Cited

U.S. PATENT DOCUMENTS

| | | | |
|---|---|---|---|
| 4,380,046 | A | 4/1983 | Fung |
| 4,435,792 | A | 3/1984 | Bechtolsheim |
| 4,435,793 | A | 3/1984 | Ochii |
| 4,727,474 | A | 2/1988 | Batcher |
| 4,843,264 | A | 6/1989 | Galbraith |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(Continued)

*Primary Examiner* — Khamdan Alrobaie
(74) *Attorney, Agent, or Firm* — Brooks, Cameron & Huebsch, PLLC

(57) ABSTRACT

Examples of the present disclosure provide apparatuses and methods for vertical bit vector shift in a memory. An example method comprises storing a vertical bit vector of data in a memory array, wherein the vertical bit vector is stored in memory cells coupled to a sense line and a plurality of access lines and the vertical bit vector is separated by at least one sense line from a neighboring vertical bit vector; and performing, using sensing circuitry, a vertical bit vector shift of a number of elements of the vertical bit vector.

20 Claims, 13 Drawing Sheets

(56) References Cited

U.S. PATENT DOCUMENTS

| | | |
|---|---|---|
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A * | 7/1995 | Hung ............ H03K 19/1776 365/189.04 |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 * | 6/2006 | Ding ............ G11C 16/3459 360/53 |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |

(56) References Cited

U.S. PATENT DOCUMENTS

| | | |
|---|---|---|
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1* | 10/2001 | Nakayama ............ G11C 29/24 365/203 |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1* | 9/2014 | Muralimanohar ... G11C 19/188 365/189.02 |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0089166 A1 | 3/2015 | Kogge |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1* | 12/2015 | Wheeler ............ G11C 11/4091 365/189.05 |
| 2015/0357020 A1 | 12/2015 | Manning |
| 2015/0357021 A1* | 12/2015 | Hush ................ G11C 11/4091 365/72 |
| 2015/0357022 A1 | 12/2015 | Hush |
| 2015/0357023 A1 | 12/2015 | Hush |
| 2015/0357024 A1* | 12/2015 | Hush ................ G11C 11/4091 365/72 |
| 2015/0357047 A1 | 12/2015 | Tiwari |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |

(56) References Cited

FOREIGN PATENT DOCUMENTS

| WO | 2013062596 | 5/2013 |
|---|---|---|
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory As a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
Warren Jr., Henry S., "Hacker's Delight", Second Edition, Oct. 2013, pp. 181-184 and 194.

\* cited by examiner

Fig. 4

| | |
|---|---|
| 551-1 | 0XFF,FF,FF,FF |
| 551-2 | 0XFF,FF,FF,FF |
| 551-3 | 0X00,00,00,00 |
| 551-4 | 0X00,00,00,00 |
| 551-5 | 0X00,FF,FF,00 |
| 551-6 | 0XFF,00,FF,00 |
| 551-7 | 0X00,00,00,0F |
| 551-8 | 0X00,00,00,00 |
| 551-9 | 0XFF,FF,FF,FF |
| 551-10 | 0XFF,FF,FF,FF |
| 551-11 | 0X00,00,00,00 |
| 551-12 | 0X00,00,00,00 |

*Fig. 5A*

| | |
|---|---|
| 551-1 | 0XFF,FF,FF,FF |
| 551-2 | 0XFF,FF,FF,FF |
| 551-3 | 0X00,00,00,00 |
| 551-4 | 0X00,00,00,00 |
| 551-5 | 0X00,FF,FF,00 |
| 551-6 | 0XFF,00,FF,00 |
| 551-7 | 0X00,00,00,0F |
| 551-8 | 0X00,00,00,00 |
| 551-9 | 0XFF,00,00,FF |
| 551-10 | 0XFF,FF,FF,FF |
| 551-11 | 0X00,FF,FF,00 |
| 551-12 | 0X00,00,00,00 |

*Fig. 5B*

| | |
|---|---|
| 551-1 | 0XFF,FF,FF,FF |
| 551-2 | 0XFF,FF,FF,FF |
| 551-3 | 0X00,00,00,00 |
| 551-4 | 0X00,00,00,00 |
| 551-5 | 0X00,FF,FF,00 |
| 551-6 | 0XFF,00,FF,00 |
| 551-7 | 0X00,00,00,0F |
| 551-8 | 0X00,00,00,00 |
| 551-9 | 0X00,00,00,FF |
| 551-10 | 0X00,FF,00,FF |
| 551-11 | 0XFF,FF,00,00 |
| 551-12 | 0XFF,00,FF,00 |

*Fig. 5C*

| | |
|---|---|
| 551-1 | 0XFF,FF,FF,FF |
| 551-2 | 0XFF,FF,FF,FF |
| 551-3 | 0X00,00,00,00 |
| 551-4 | 0X00,00,00,00 |
| 551-5 | 0X00,FF,FF,00 |
| 551-6 | 0XFF,00,FF,00 |
| 551-7 | 0X00,00,00,0F |
| 551-8 | 0X00,00,00,00 |
| 551-9 | 0X00,00,00,F0 |
| 551-10 | 0X00,FF,00,F0 |
| 551-11 | 0XFF,FF,00,00 |
| 551-12 | 0XFF,00,FF,00 |

*Fig. 5D*

| | 633 SHIFTED | 635 TEMP | 637 COMP_COMP | 639 DESTINATION |
|---|---|---|---|---|
| 661-1 | 0XFF,FF,FF,FF | 0X00,00,00,00 | 0X00,00,00,00 | 0X00,00,00,00 |
| 661-2 | 0XFF,FF,FF,FF | 0X00,00,00,00 | 0XFF,00,FF,00 | 0X00,00,00,00 |
| 661-3 | 0XFF,FF,FF,FF | 0XFF,00,FF,00 | 0XFF,00,FF,00 | 0X00,00,00,00 |
| 661-4 | 0XFF,FF,FF,FF | 0XFF,00,FF,00 | 0XFF,00,FF,00 | 0X00,00,00,00 |
| 661-5 | 0XFF,FF,FF,FF | 0XFF,00,FF,00 | 0X00,FF,00,FF | 0X00,00,00,00 |
| 661-6 | 0XFF,FF,FF,FF | 0XFF,00,FF,00 | 0X00,00,00,00 | 0X00,00,00,00 |
| 661-7 | 0XFF,FF,FF,FF | 0XFF,00,FF,00 | 0XFF,00,FF,00 | 0XFF,00,FF,00 |

*Fig. 6*

VERTICAL BIT VECTOR SHIFT IN MEMORY

PRIORITY INFORMATION

This application is a Continuation of U.S. application Ser. No. 15/057,736, filed Mar. 1, 2016, which issues as U.S. Pat. No. 9,697,876 on Jul. 4, 2017, the contents of which are included herein by reference.

TECHNICAL FIELD

The present disclosure relates generally to semiconductor memory apparatuses and methods, and more particularly, to apparatuses and methods related to vertical bit vector shift in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and/or associated functional unit circuitry) may be external to the memory array, and data is accessed via a bus between the processing resources and the memory array to execute instructions. Data can be moved from the memory array to registers external to the memory array via a bus.

BRIEF DESCRIPTION OF THE DRAWINGS

FIG. 4 illustrates a table showing the states of memory cells of a number of vertical bit vectors in accordance with a number of embodiments of the present disclosure.

FIGS. 5A-5D illustrate tables showing the states of memory cells of an array during a number of shift operations associated with a vertical bit vector shift in accordance with a number of embodiments of the present disclosure.

FIG. 6 illustrates a table showing the states of memory cells of an array during a shift iteration associated with vertical bit vector shift in accordance with a number of embodiments of the present disclosure.

DETAILED DESCRIPTION

Figure 1:
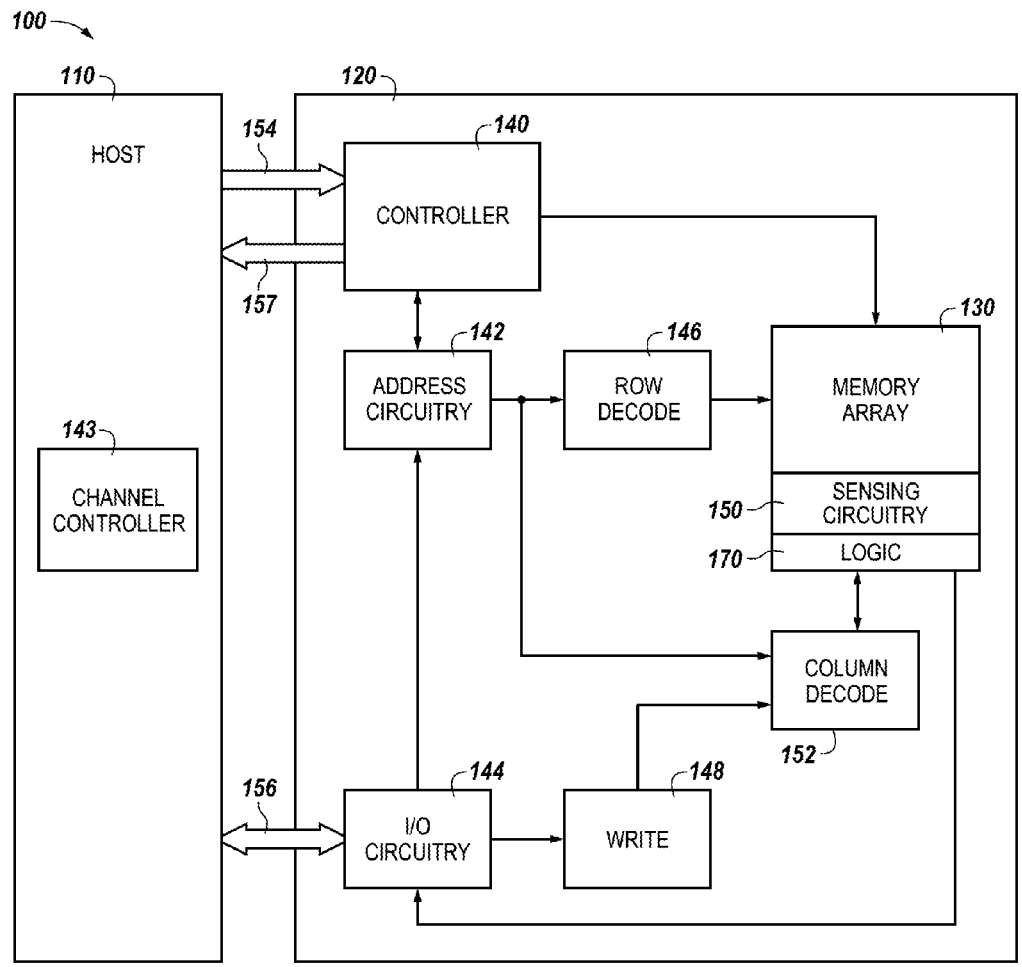
FIG. 1 is a block diagram of an apparatus in the form of a computing system including a memory device in accordance with a number of embodiments of the present disclosure.

The present disclosure includes apparatuses and methods related to vertical bit vector shift in memory. An example method comprises storing a vertical bit vector of data in a memory array, wherein the vertical bit vector is stored in memory cells coupled to a sense line and a plurality of access lines and the vertical bit vector is separated by at least one sense line from a neighboring vertical bit vector; and performing, using sensing circuitry, a vertical bit vector shift of a number of elements of the vertical bit vector. As used herein, the term "bit vector" I intended to mean a physically contiguous number of bits in memory, whether physically contiguous in rows (e.g., horizontally oriented) or columns (e.g., vertically oriented) in an array of memory cells. A vertical bit vector shift can be performed in memory. For example, a vertical bit vector shift can include shifting elements of a vertical bit vector according to elements of a vertical shift bit vector, for example. Each element of a vertical shift bit vector can correspond to an amount (e.g., a number of positions in the vertical bit vector) that each element of a vertical bit vector can be shifted. For example, a vertical shift bit vector that has a shift value of 1 can correspond to a shift of one position of each element of a vertical bit vector. For example, a shift value of 1 in a vertical shift bit vector can move the first element of a vertical bit vector into the second position of the vertical bit vector, and the second element of the vertical bit vector into the third position, and so on. A shift value of 2 in a vertical shift bit vector can move the first element of a vertical bit vector into the third position of the vertical bit vector, and the second element of the vertical bit vector into the fourth position, and so on. A position in the vertical bit vector where the element is shifted but not replaced by another shifted element can include a value of 0 during a vertical bit vector shift.

In a number of embodiments, a vertical bit vector shift can be performed by shifting elements of vertical bit vectors toward a most significant bit of the vertical bit vectors. A vertical bit vector shift can also be performed by shifting elements of vertical bit vectors toward a least significant bit of the vertical bit vectors.

A number of embodiments of the present disclosure can provide a reduction of the number of computations and/or time involved in performing a vertical bit vector shift relative to previous approaches. For instance, the number of computations and/or the time to perform a vertical bit vector shift can be reduced by performing operations in memory in parallel (e.g., simultaneously). Performing a vertical bit vector shift as described herein can also reduce power consumption as compared to previous approaches. In accordance with a number of embodiments, a vertical bit vector shift can be performed on elements (e.g., data in the form of bit vectors including elements of stored vertically in an array) without transferring data out of the memory array and/or sensing circuitry via a bus (e.g., data bus, address bus, control bus, etc.). A vertical bit vector shift can involve performing a number of operations (e.g., AND operations, OR operations, shift operations, invert operations, and, etc.). However, embodiments are not limited to these examples.

In various previous approaches, bit vectors may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single function can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU), which can involve performing a sense line address access (e.g., firing of a column decode signal) in order to transfer data from sense lines onto I/O lines, moving the data to the array periphery, and providing the data to a register in association with performing a vertical bit vector shift, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 331 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 120 in accordance with a number of embodiments of the present disclosure. As used herein, a memory device 120, memory controller 140, channel controller 143, bank arbiter 145, high speed interface (HSI) 141, memory array 130, sensing circuitry 150, and/or periphery logic 170 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2 and 3.

The memory device 120 includes address circuitry 142 to latch address signals provided over a data bus 156 (e.g., an I/O bus) through I/O circuitry 144. Status, exception, and other data information can be provided from the memory controller 140 on the memory device 120 to a channel controller 143 via a high speed interface (HSI) (both shown in FIG. 1B), including an out-of-band bus 157 (shown in FIG. 1B), which in turn can be provided from the memory device 120 to the host 110. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Memory controller 140, e.g., bank control logic and/or sequencer, decodes signals provided by control bus 154 from the host 110. These signals can include chip enable signals, write enable signals, and address latch signals that are used to control operations performed on the memory array 130, including data read, data write, and data erase operations. In various embodiments, the memory controller 140 is responsible for executing instructions from the host 110. The memory controller 140 can be a state machine, a sequencer, or some other type of controller. The controller 140 can control shifting data (e.g., right or left) in an array, e.g., memory array 130.

An example of the sensing circuitry 150 is described further below in association with FIGS. 2A and 2B. For instance, in a number of embodiments, the sensing circuitry 150 can comprise a number of sense amplifiers and a number of compute components, which may comprise a latch serving as a Comp_Compulator and can be used to perform logical operations (e.g., on data associated with complementary sense lines). In a number of embodiments, the sensing circuitry (e.g., 150) can be used to perform a vertical bit vector shift using data stored in array 130 as inputs and store the results of the bit vector population count determination back to the array 130 without transferring via a sense line address access (e.g., without firing a column decode signal). As such, a vertical bit vector shift can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to an external ALU (e.g., via a bus). The external ALU circuitry could include a number of registers and would perform compute functions using the operands, and the result would be transferred back to the array via the I/O lines. In contrast, in a number of embodiments of the present disclosure, sensing circuitry (e.g., 150) is configured to perform a vertical bit vector shift on data stored in memory cells in memory array 130 and store the result back to the array 130 without enabling a local I/O line coupled to the sensing circuitry. The sensing circuitry 150 can be formed on pitch with the memory cells of the array. Additional peripheral sense amplifier and/or logic 170 can be coupled to the sensing circuitry 150.

As such, in a number of embodiments, circuitry, registers, and/or an ALU external to array 130 and sensing circuitry 150 may not be needed to perform the vertical bit vector shift as the sensing circuitry 150 can be operated to perform the appropriate operations involved in performing the vertical bit vector shift using the address space of memory array 130. Additionally, the vertical bit vector shift can be performed without the use of an external processing resource.

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

Figure 2A:
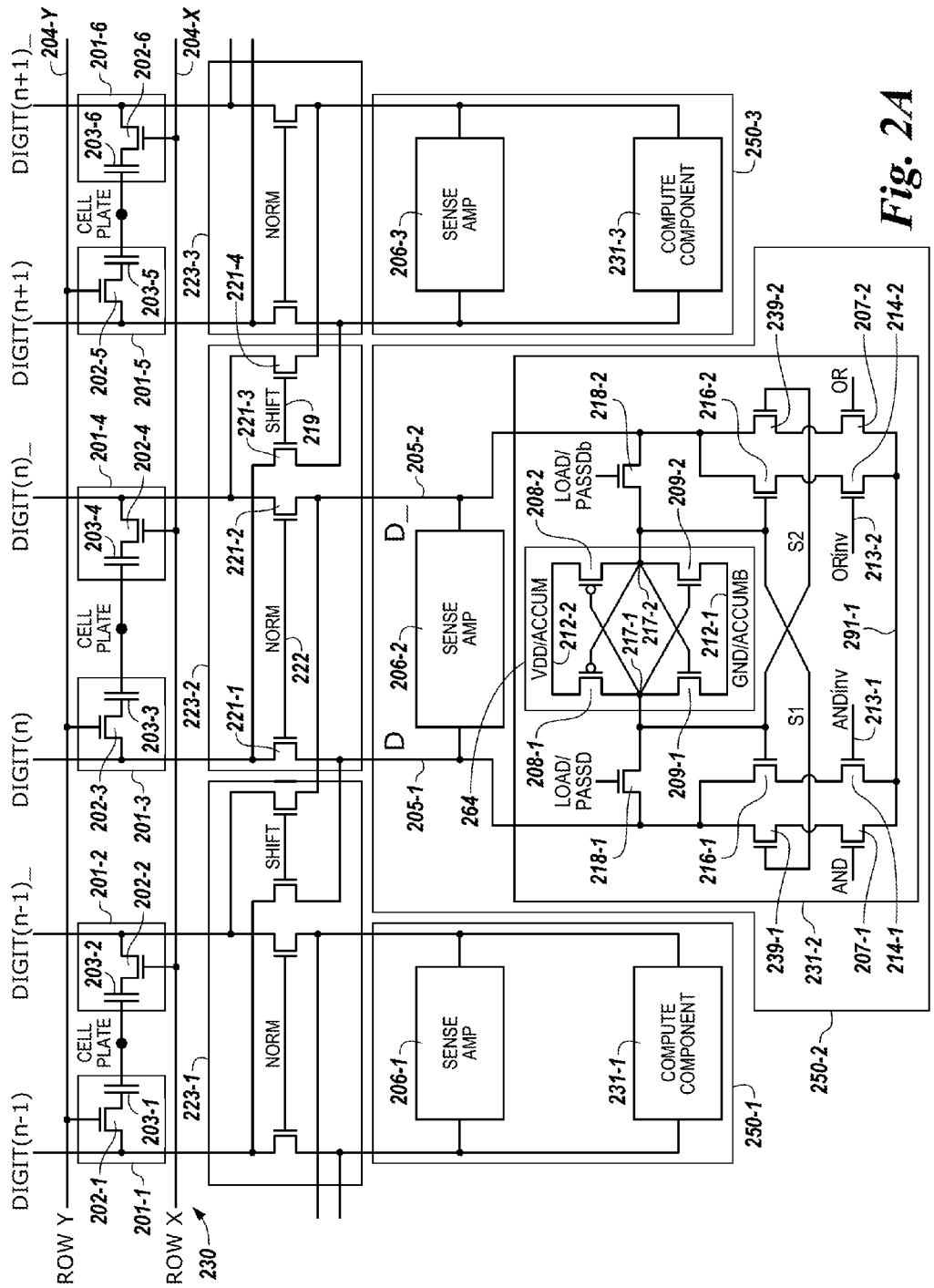
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell comprises a storage element (e.g., capacitor) and an access device (e.g., transistor). For instance, memory cell 201-1 comprises transistor 202-1 and capacitor 203-1, memory cell 201-2 comprises transistor 202-2 and capacitor 203-2, memory cell 201-3 comprises transistor 202-3 and capacitor 203-3, and memory cell 201-4 comprises transistor 202-4 and capacitor 203-4, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-3 can be coupled to data line 205-1 (D), a second source/drain region of transistor 202-3 can be coupled to capacitor 203-3, and a gate of a transistor 202-3 can be coupled to word line 204-Y. A first source/drain region of a transistor 202-4 can be coupled to data line 205-2 (D_), a second source/drain region of transistor 202-4 can be coupled to capacitor 203-4, and a gate of a transistor 202-4 can be coupled to word line 204-X. The cell plate, as shown in FIG. 2A, can be coupled to each of capacitors 203-3 and 203-4. The cell plate can be a common node to which a reference voltage (e.g., ground) can be applied in various memory array configurations.

The memory array 230 is coupled to sensing circuitry 250-1, 250-2, 250-3, etc., in accordance with a number of embodiments of the present disclosure. Sensing circuitry comprises a sense amplifier and a compute component corresponding to respective columns of memory cells (e.g., coupled to respective pairs of complementary data lines). In this example, the sensing circuitry 250-1 comprises a sense amplifier 206-1 and a compute component 231-1 corresponding to respective columns of memory cells (e.g., memory cells 201-1 and 201-2 coupled to respective pairs of complementary data lines). Sensing circuitry 250-2 comprises a sense amplifier 206-2 and a compute component 231-2 corresponding to respective columns of memory cells (e.g., memory cells 201-3 and 201-4 coupled to respective pairs of complementary data lines). Sensing circuitry 250-3 comprises a sense amplifier 206-3 and a compute component 231-3 corresponding to respective columns of memory cells (e.g., memory cells 201-5 and 201-6 coupled to respective pairs of complementary data lines). A sense amplifier (e.g., sense amplifier 206-1) can comprise a cross coupled latch, which can be referred to herein as a primary latch. The sense amplifier (e.g., sense amplifier 206-1) can be configured, for example, as described with respect to FIG. 2B.

In the example illustrated in FIG. 2A, the circuitry corresponding to compute component 231-2 comprises a static latch 264 and an additional ten transistors that implement, among other things, a dynamic latch. For ease of reference, compute component 231-2 has been illustrated in an expanded format to describe the functioning of the compute component. Additional compute components (e.g., compute components 231-1 and 231-3) include elements of the expanded format of compute component 231-2 but are not illustrated in FIG. 2A. The dynamic latch and/or static latch of the compute component 231-2 can be collectively referred to herein as a secondary latch, which can serve as an Comp_Compulator. As such, the compute component 231-2 can operate as and/or be referred to herein as a Comp_Compulator. The compute component 231-2 can be coupled to each of the data lines D 205-1 and D_205-2 as shown in FIG. 2A. However, embodiments are not limited to this example. The transistors of compute component 231-2 can all be n-channel transistors (e.g., NMOS transistors), for example.

In this example, data line D 205-1 can be coupled to a first source/drain region of transistors 216-1 and 239-1, as well as to a first source/drain region of load/pass transistor 218-1. Data line D_205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores Comp_Compulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231-2 shown in FIG. 2A has the benefit of balancing the sense amplifier for functionality when the pull-down transistors 207-1, 207-2, 214-1, and 214-2 are conducting before the sense amplifier 206-2 is fired (e.g., during pre-seeding of the sense amplifier 206-2). As used herein, firing the sense amplifier 206-2 refers to enabling the sense amplifier 206-2 to set the primary latch and subsequently disabling the sense amplifier 206-2 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ANDinv control signal line 213-2) can be operated to pull-down data line 205-2 (D_).

The latch 264 can be controllably enabled by coupling to an active negative control signal line 212-1 (COMP_COMPB) and an active positive control signal line 212-2 (COMP_COMP) rather than be configured to be continuously enabled by coupling to ground and $V_{DD}$. In various embodiments, load/pass transistors 208-1 and 208-2 can each having a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 2A is not contingent on the LOAD control signal being elevated to a voltage greater than $V_{DD}$.

According to some embodiments, the gate of load/pass transistor 218-1 can be coupled to a PASSD control signal, and the gate of load/pass transistor 218-2 can be coupled to a PASSDB control signal. In the configuration where the gates of transistors 218-1 and 218-2 are respectively coupled to one of the PASSD and PASSDB control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent Comp_Compulator (e.g., through the shift circuitry 223-2 in memory array 230, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231-2, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines D 205-1 and D 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
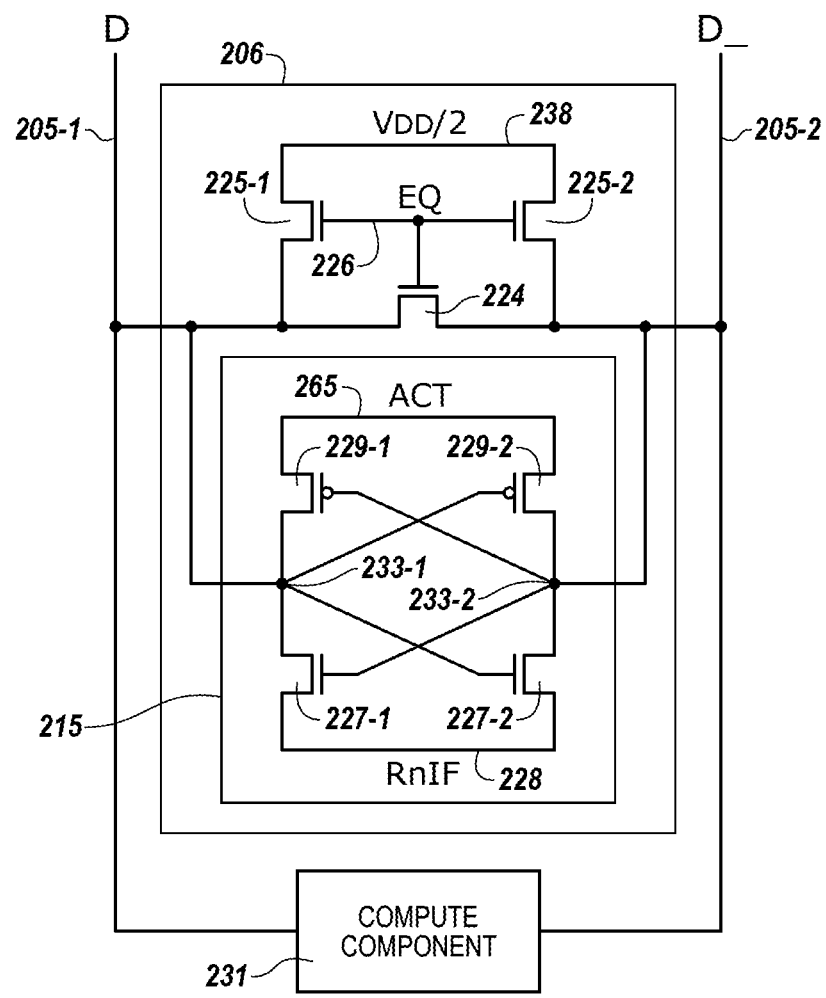
FIG. 2B is a schematic diagram illustrating a portion of sensing circuitry in accordance with a number of embodiments of the present disclosure.

In this example, a second source/drain region of transistor 209-1 and 209-2 is commonly coupled to a negative control signal line 1312-1 (e.g., ground (GND) or COMP_COMPB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or COMP_COMP control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206-2 and the compute component 231-2 can be coupled to the array 230 via shift circuitry 223-2. In this example, the shift circuitry 223-2 comprises a pair of isolation devices (e.g., isolation transistors 221-1 and 221-2) coupled to data lines 205-1 (D) and 205-2 (D_), respectively). The isolation transistors 221-1 and 221-2 are coupled to a control signal 222 (NORM) that, when activated, enables (e.g., turns on) the isolation transistors 221-1 and 221-2 to couple the corresponding sense amplifier 206-2 and compute component 231-2 to a corresponding column of memory cells (e.g., to a corresponding pair of complementary data lines 205-1 (D) and 205-2 (D_)). According to various embodiments, conduction of isolation transistors 221-1 and 221-2 can be referred to as a "normal" configuration of the shift circuitry 223-2.

In the example illustrated in FIG. 2A, the shift circuitry 223-2 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206-2 and compute component 231-2 are coupled to a different pair of complementary data lines (e.g., a pair of complementary data lines different than the pair of complementary data lines to which isolation transistors 221-1 and 221-2 couple the particular sense amplifier 206-2 and compute component 231-2), or can couple a particular sense amplifier 206-2 and compute component 231-2 to another memory array (and isolate the particular sense amplifier 206-2 and compute component 231-2 from a first memory array). According to various embodiments, the shift circuitry 223-2 can be considered to be a portion of (e.g., within) the sensing circuitry 250-2, for instance.

Although the shift circuitry 223-2 shown in FIG. 2A includes isolation transistors 221-1 and 221-2 used to couple particular sensing circuitry 250-2 (e.g., a particular sense amplifier 206-2 and corresponding compute component 231-2) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250-2 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A). Shift circuitry 223-1 can include isolation transistors used to couple particular sensing circuitry 250-1 to a particular pair of complementary data lines (e.g., DIGIT(n−1) and DIGIT(n−1)_) and isolation transistors arranged to couple the particular sensing circuitry 250-1 to an adjacent pair of complementary data lines in one particular direction (e.g., adjacent data lines DIGIT(n) and DIGIT(n) shown in FIG. 2A). Shift circuitry 223-3 can include isolation transistors used to couple particular 250-3 to a particular pair of complementary data lines (e.g., DIGIT(n+1) and DIGIT(n+1)_) and isolation transistors arranged to couple the particular sensing circuitry 250-3 to an adjacent pair of complementary data lines in one particular direction (e.g., adjacent data lines DIGIT (n) and DIGIT(n) to the left and DIGIT(n+2) and DIGIT(n+2)_ to the right (not shown)).

Embodiments of the present disclosure are not limited to the configuration of shift circuitry 223-2 shown in FIG. 2A. For example, determining whether to shift in a particular direction to perform a shift operation is independent of the circuitry implementation. In a number of embodiments, shift circuitry 223-2 such as that shown in FIG. 2A can be operated (e.g., in conjunction with sense amplifiers 206-2 and compute components 231-2) in association with performing mathematical operations such as adding and subtracting operations without transferring data out of the sensing circuitry 250 via an I/O line (e.g., local I/O line (IO/IO_)), for instance.

Although not shown in FIG. 2A, each column of memory cells can be coupled to a column decode line that can be activated to transfer, via local I/O line, a data value from a corresponding sense amplifier 206-2 and/or compute component 231-2 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 223-2 can be operated in conjunction with sense amplifiers 206-2 and compute components 231-2 to perform without transferring data to a control component external to the array, for instance.

FIG. 2B is a schematic diagram illustrating a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231-2 and/or the memory cells of an array (e.g., 230 shown in FIG. 2A) to which they are coupled, which may conform to a particular feature size (e.g., $4F^2$, $6F^2$, etc.). The sense amplifier 206 comprises a latch 215 including four transistors coupled to a pair of complementary data lines D 205-1 and D_ 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231-2, which may be referred to herein as an Comp_Compulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 290 (ACT). The ACT signal 290 can be a supply voltage (e.g., $V_{DD}$) and the RnIF signal can be a reference voltage (e.g., ground). Activating signals 228 and 290 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206 and compute component 231-2, and the result can be stored in the sense amplifier and/or compute component.

The sensing circuitry 250 can be operated in several modes to perform logical operations, including a first mode in which a result of the logical operation is initially stored in the sense amplifier 206, and a second mode in which a result of the logical operation is initially stored in the compute component 231-2. Additionally with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206.

As described further below, the sense amplifier 206 can, in conjunction with the compute component 231-2, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing various operations (e.g., logical operations, mathematical operations, etc.) using less power than various previous approaches. Additionally, since a number of embodiments eliminate the need to transfer data across I/O lines in order to perform operations (e.g., between memory and discrete processor), a number of embodiments can enable an increased parallel processing capability as compared to previous approaches.

Figure 3:
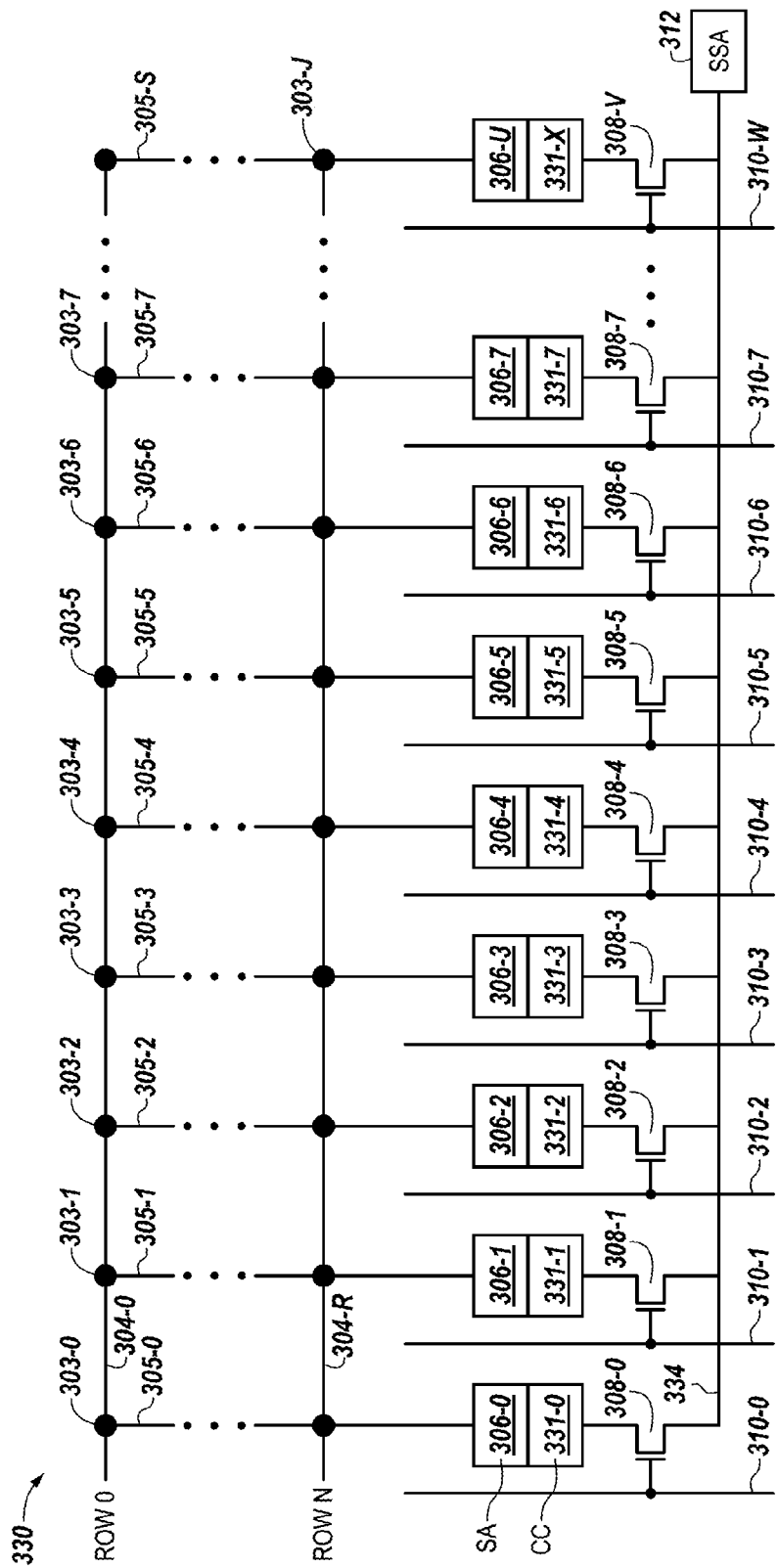
FIG. 3 illustrates a schematic diagram of a portion of a memory array in accordance with a number of embodiments of the present disclosure.

FIG. 3 illustrates a schematic diagram of a portion of a memory array 301 in accordance with a number of embodiments of the present disclosure. The array 301 includes memory cells (referred to generally as memory cells 303, and more specifically as 303-0 to 303-J) coupled to rows of access lines 304-0, . . . , 304-R and columns of sense lines 305-0, 305-1, 305-2, 305-3, 305-4, 305-5, 305-6, 305-7, . . . , 305-S. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, . . . , 306-U (refereed generally as sense amplifiers 306) coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-1, 308-2, 308-3, 308-4, 308-5, 308-6, 308-7, . . . , 308-V. In this example, the sensing circuitry also comprises a number of compute components 331-0, 331-1, 331-2, 331-3, 331-4, 331-5, 331-6, 331-7, . . . , 331-X (referred to generally as compute components 331) coupled to the respective sense lines. Column decode lines 310-1 to 310-W are coupled to the gates of transistors 308-1 to 308-V, respectively, and can be selectively activated to transfer data sensed by respective sense amps 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306. In this way, in an array comprising 16K columns, 16K vertically stored data elements could be processed in parallel by the corresponding 16K 1-bit processors. For example, each column can process 1-bit information in parallel.

The memory cells 303 can store a number of bit vectors. For example, memory cells 303 that are couple to a particular sense line 305 can store a vertical bit vector. For example, in FIG. 3 the memory cells that are coupled to sense line 305-0 and coupled to access lines 304-0 to 304-R can store a vertical bit vector having R+1 bits.

In a number of embodiments, the sensing circuitry (e.g., compute components 331 and sense amplifiers 306) is configured to perform a vertical bit vector shift of a number of elements stored in array 301. As an example, a first vertical bit vector of a plurality of vertical bit vectors can be stored in a first group of memory cells coupled to a particular sense line (e.g., 305-0) and to a first number of access lines (e.g., 304-0 to 304-R), a second vertical bit vector of a plurality of vertical bit vectors can be stored in a second group of memory cells coupled to a particular sense line (e.g., 305-1) and to a first number of access lines (e.g., 304-0 to 304-R), a third vertical bit vector of a plurality of vertical bit vectors can be stored in a third group of memory cells coupled to a particular sense line (e.g., 305-2) and to a first number of access lines (e.g., 304-0 to 304-R), and a $S^{th}$ vertical bit vector of a plurality of vertical bit vectors can be stored in a $S^{th}$ group of memory cells coupled to a particular sense line (e.g., 305-S) and to a first number of access lines (e.g., 304-0 to 304-R). While the example illustrates a fixed length of R+1 bits for each of the vertical bit vectors, embodiments are not so limited. The array 330 can store S+1 vertical bit vectors and each element of the vertical bit vectors coupled to a particular access line can processed in parallel by the corresponding sensing circuitry.

Figure 4:
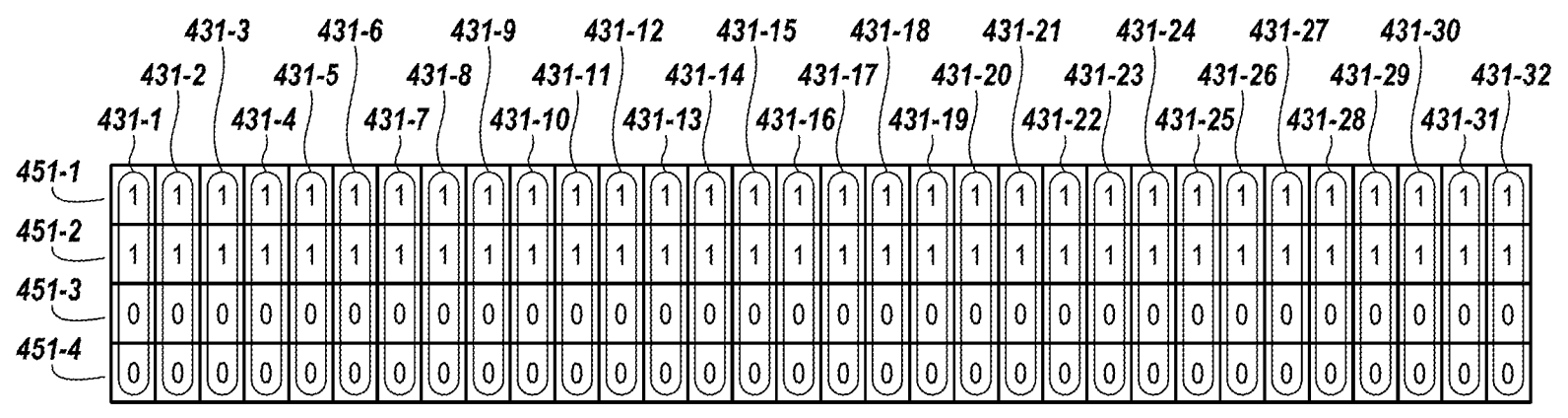

FIG. 4 illustrates a table showing the states of memory cells of a number of vertical bit vectors in accordance with a number of embodiments of the present disclosure. In FIG. 4, a number of vertical bit vectors (referred to generally as vertical bit vectors 431, and more specifically as 431-1 to 431-32). FIG. 4 illustrates 32 vertical bit vectors that will be vertically shifted according to embodiments of the present disclosure, although examples of the present disclosure are not are not limited to 32 vertical bit vectors and can include a number of vertical bit vectors in each column of memory cells in an array of memory cells. In a number of embodiments, each sense line of an array may be coupled to a number memory cells that include a number of vertical bit vectors and each memory cell of the number of vertical bit vectors coupled to a common access line may be processed in parallel.

The vertical bit vectors 431 in FIG. 4 include 4-bit vertical bit vectors, where each of vertical bit vectors 431 includes bit values of [1100], although examples are not limited to 4-bit bit vectors. The vertical bit vectors 431 illustrated in FIG. 4 will be used in the examples described below in association with FIGS. 5A-6B. The vertical bit vectors 431 include a first element [1] at first position 451-1, a second element [1] at a second position 451-2, a third element [0] at a third position 451-3, and a fourth element [0] at a fourth position 451-4.

FIGS. 5A-5D illustrate tables showing the states of memory cells of an array at a particular phase associated with vertical bit vector shifting in accordance with a number of embodiments of the present disclosure.

FIG. 5A illustrates a number of vertical bit vectors, a number of vertical shift bit vectors, and a number of vertical destination bit vectors prior to performing a vertical bit vector shift.

The vertical bit vectors (e.g., source bit vectors) that are to be shifted are stored in an array, where a first element of the vertical bit vectors are in a first position 551-1, the second element of the vertical bit vectors are in a second position 551-2, the third element of the vertical bit vectors are in a third position 551-3, and a fourth element of the vertical bit vectors are in a fourth position 551-4. The elements of the vertical bit vectors that are in the first position 551-1 are illustrated in hexadecimal form as 0xFF,FF,FF,FF, which corresponds to the first element 451-1 of each vertical bit vector shown in FIG. 4 and has a binary value of [1], respectively. The elements of the vertical bit vectors that are in the second position 551-2 are illustrated in hexadecimal form as 0xFF,FF,FF,FF which correspond to the second element 451-2 of each vertical bit vector shown in FIG. 4 and has a binary value of [1], respectively. The elements of the vertical bit vectors that are in the third position 551-3 are illustrated in hexadecimal form as 0x00, 00,00,00, which correspond to the third element 451-3 of each vertical bit vector and has a binary value of [0], respectively. The elements of the vertical bit vectors that are in the fourth position 551-4 are illustrated in hexadecimal form as 0x00,00,00,00, therefore the fourth element of each vertical bit vector is has a binary value of [0].

The vertical shift bit vectors indicate an amount of shift for the elements and are stored in positions 551-5 to 551-8. The elements of the vertical shift bit vectors are operands for performing a vertical bit vector shift. The vertical shift bit vectors include a number of elements, wherein an element at a particular position in the vertical shift bit vectors corresponds to an amount of shift. In a number of embodiments, the amount of shift for an element at a particular position in the vertical shift bit vector is $2^{n-1}$, where n is an element's position in the vertical bit vector element. For example, an element in the first position 551-5 of the vertical shift bit vector having a binary value of [1] corresponds to a shift of 1 position, an element in the second position 551-6 of the vertical shift bit vector having a binary value of [1] corresponds to a shift of 2 positions, an element in the third position 551-7 of the vertical shift bit vector having a binary value of [1] corresponds to a shift of 4 positions, and an element in the fourth position 551-8 of the vertical shift bit vector having a binary value of [1] corresponds to a shift of 8 positions, and so on. In a vertical shift bit vector, a bit having a binary value of [1] indicates that the elements of a corresponding vertical bit vector are shifted by an amount that corresponds to the position of the bit in the vertical shift bit vector. A bit having a binary value of [0] indicates that the elements of a corresponding vertical bit vector are not shifted by an amount that corresponds to the position of the bit in the vertical shift bit vector.

The vertical shift bit vectors indicate an amount of shift for the elements of a vertical bit vector when performing a vertical bit vector shift. Each vertical bit vector that is to be shifted and is stored in a column of an array can have a corresponding vertical shift bit vector that is stored in the same column. The vertical shift bit vectors can indicate an amount of shift for each corresponding vertical bit vector, where a first element of the vertical shift bit vectors are in the first position 551-5, the second element of the vertical shift bit vectors are in the second position 551-6, the third element of the vertical shift bit vectors are in the third position 551-7, and a fourth element of the vertical shift bit vectors are in the fourth position 551-8.

The elements of the vertical shift bit vectors that are in the first position 551-5, which corresponds to a shift of 1, are illustrated in hexadecimal form as 0x00,FF,FF,00. According to the elements shown in the first position 551-5, for example, the first 8 binary bits of the first element 451-1 of the vertical bit vectors shown in FIG. 4 (e.g., the first and second data units of the hexadecimal form 551-9 in FIG. 5A, [0xFF,FF,FF,FF] indicated in bold) will not be shifted during a first shift operation, the next 16 vertical bit vectors (e.g., the third, fourth, fifth, and sixth data units of the hexadecimal form 551-9, [0xFF,FF,FF,FF] indicated in bold) will be shifted by 1 position during a first shift operation, and the last 8 vertical bit vectors (e.g., the seventh and the eighth data units of the hexadecimal form 551-9, [0xFF,FF,FF,FF] indicated in bold) will not be shifted during a first shift operation. The shift of position 1 may be understood by referring to FIGS. 5A and 5B (e.g., change in elements between the positions 551-9 to 551-12 shown in FIG. 5A and the positions 551-9 and 551-12 shown in FIG. 5B). The shift of 1 positions may be vertical by one row (e.g., to move an element from a previous position to a current position that is in the same column and a different (e.g., neighboring) row from the previous position).

The elements of the vertical shift bit vectors that are in the second position 551-6, which corresponds to a shift of 2, are illustrated in hexadecimal form as 0xFF,00,FF,00. According to the elements shown in the first position 551-6, for example, the first 8 vertical bit vectors (e.g., the first and second data units of the hexadecimal form 551-9 in FIG. 5B, [0xFF,00,00,FF] indicated in bold) will be shifted by 2 positions during a second shift operation, the next 8 vertical bit vectors (e.g., the third and fourth data units of the hexadecimal form 551-9, [0xFF,00,00,FF] indicated in bold) will not be shift during a second shift operation, the next 8 vertical bit vectors (e.g., the fifth and sixth data units of the hexadecimal form 551-9, [0xFF,00,00,FF] indicated in bold) will be shifted by 2 positions during a second shift operation, and the final 8 vertical bit vectors (e.g., the seventh and eighth data units of the hexadecimal form 551-9, [0xFF,00, 00,FF] indicated in bold) will not be shifted during a second shift operation. The shift of 2 positions may be understood by referring to FIGS. 5B and 5C (e.g., change in elements between the positions 551-9 to 551-12 shown in FIG. 5B and the positions 551-9 to 551-12 shown in FIG. 5C). The shift of 2 positions may be vertical by two rows.

The elements of the vertical shift bit vectors that are in the third position 551-7, which corresponds to a shift of 4, are illustrated in hexadecimal form as 0x00,00,00,0F. According to the elements shown in the first position 551-7, for example, the first 28 vertical bit vectors (e.g., the first, second, third, fourth, fifth, sixth, and seventh data units of the hexadecimal form 551-9 in FIG. 5C, [0x00,00,00,FF] indicated in bold) will not be shifted during a third shift operation and the final 4 vertical bit vectors (e.g., eighth data unit of the hexadecimal form 551-9, [0x00,00,00,FF] indicated in bold) will be shifted by 4 positions during a third shift operation. The shift of 4 positions may be understood by referring to FIGS. 5C and 5D (e.g., change in elements between the positions 551-9 to 551-12 shown in FIG. 5C and the positions 551-9 to 551-12 shown in FIG. 5D). The shift of 4 positions may be vertical by four rows.

The elements of the vertical shift bit vectors that are in the fourth position 551-8, which corresponds to a shift of 8, are illustrated in hexadecimal form as 0x00,00,00,00, therefore all 32 vertical bit vectors will not be shifted during a fourth shift operation.

The vertical destination bit vectors can be the bit vectors where a shifted vertical bit vector is located. In a number of embodiments, a vertical bit vector shift includes a number of shift operations and the results of each shift operation can be stored in the vertical destination bit vectors. The vertical destination bit vectors illustrated in FIG. 5A are the same vertical bit vectors as the source bit vectors described above. In a number of embodiments, the source bit vectors are copied to the destination locations in the array as vertical destination bit vectors as part of a set up phase first step of a vertical bit vector shift. In FIG. 5A, the destination vertical bit vectors each include a first element at a first position 551-9, a second element at a second position 551-10, a third element at a third position 551-11, and a fourth element at a fourth position 551-12. A vertical bit vector shift can include performing a number of shift operations, wherein a shift operation is performed for each element of a vertical shift bit vector. Each shift operation can include performing a number of iterations, wherein each iteration shifts an element according to an element of the vertical shift bit vector.

FIG. 5B illustrates a number of vertical bit vectors, a number of vertical shift bit vectors, and a number of vertical destination bit vectors after performing a first shift operation of a vertical bit vector shift. The first shift operation corresponds to shifting the vertical bit vectors according the elements in the first position (position 551-5) of the vertical shift bit vectors. In FIG. 5B, the elements of the vertical bit vectors that have a corresponding vertical shift bit vector with a value of [1] in first position 551-5 are shifted one position (e.g., vertically one row) and the elements that have a corresponding vertical shift bit vector with a value of [0] in the first position 551-5 remain in their original position.

In FIG. 5B, the results of the first shift operation of the vertical bit vector shift are located in the destination vertical bit vectors (e.g., in the positions 551-9 to 551-12). The elements of the destination vertical bit vectors that are in the first position 551-9 are illustrated in hexadecimal form as 0xFF,00,00,FF. The elements of destination vertical bit vectors that are in the second position 551-10 are illustrated in hexadecimal form as 0xFF,FF,FF,FF. The elements of destination vertical bit vectors that are in the third position 551-11 are illustrated in hexadecimal form as 0x00,FF,FF,00. The elements of destination vertical bit vectors that are in the fourth position 551-12 are illustrated in hexadecimal form as 0x00,00,00,00.

In FIG. 5B, the elements of the first group of 8 vertical bit vectors and fourth group of 8 vertical bit vectors remain in position during the first shift operation due to the vertical shift bit vectors having a value of [0] in the first position 551-5. The elements of the second group of 8 vertical bit vectors and the third group of 8 vertical bit vectors are shifted down one position (e.g., one row) due to the corresponding vertical shift bit vectors having a value of [1] in the first position 551-5. Therefore, the elements in the first position (551-9 in FIG. 5A) of the second group of 8 vertical bit vectors and the third group of 8 vertical bit vectors are shifted to the second position 551-10 and are replaced with a value of [0]. The elements in the second position (551-10 in FIG. 5A) of the second group of 8 vertical bit vectors and the third group of 8 vertical bit vectors are shifted to the third position 551-11. The elements in the third position (551-11 in FIG. 5A) of the second group of 8 vertical bit vectors and the third group of 8 vertical bit vectors are shifted to the fourth position 551-12.

FIG. 5C illustrates a number of vertical bit vectors, a number of vertical shift bit vectors, and a number of vertical destination bit vectors after performing a second shift operation of a vertical bit vector shift. The second shift operation corresponds to shifting the vertical bit vectors according the elements in the second position (position 551-6) of the vertical shift bit vectors. In FIG. 5C, the elements of the vertical bit vectors that have a corresponding vertical shift bit vector with a value of [1] in second position 551-6 are shifted two positions (e.g., vertically two rows) and the elements that have a corresponding vertical shift bit vector with a value of [0] in the second position 551-6 remain their state after the first shift operation.

In FIG. 5C, the results of the second shift operation of the vertical bit vector shift are located in the destination vertical bit vectors. The elements of the destination vertical bit vectors that are in the first position 551-9 are illustrated in hexadecimal form as 0x00,00,00,FF. The elements of destination vertical bit vectors that are in the second position 551-10 are illustrated in hexadecimal form as 0x00,FF,00,FF. The elements of destination vertical bit vectors that are in the third position 551-11 are illustrated in hexadecimal form as 0xFF,FF,00,00. The elements of destination vertical bit vectors that are in the fourth position 551-12 are illustrated in hexadecimal form as 0xFF,00,FF,00.

In FIG. 5C, the elements of the second group of 8 vertical bit vectors and fourth group of 8 vertical bit vectors remain in position during the second shift operation due to the vertical shift bit vectors having a value of [0] in the second position 551-6. The elements of the first group of 8 vertical bit vectors and the third group of 8 vertical bit vectors are shifted down two positions (e.g., two rows) due to the corresponding vertical shift bit vectors having a value of [1] in the second position 551-6. Therefore, the elements in the first position (551-9 in FIG. 5B) of the first group of 8 vertical bit vectors and the third group of 8 vertical bit vectors are shifted to the third position 551-11 and are replaced with a value of [0]. The elements in the second position (551-10 in FIG. 5B) of the first group of 8 vertical bit vectors and the third group of 8 vertical bit vectors are shifted to the fourth position 551-12 and are replaced with a value of [0].

FIG. 5D illustrates a number of vertical bit vectors, a number of vertical shift bit vectors, and a number of vertical destination bit vectors after performing a third shift operation of a vertical bit vector shift. The third shift operation corresponds to shifting the vertical bit vectors according the elements in the third position (position 551-7) of the vertical shift bit vectors. In FIG. 5D, the elements of the vertical bit vectors that have a corresponding vertical shift bit vector with a value of [1] in third position 551-6 are shifted four positions (e.g., vertically four rows) and the elements that have a corresponding vertical shift bit vector with a value of [0] in the third position 551-7 remain in their state after the second shift operation.

In FIG. 5D, the results of the third shift operation of the vertical bit vector shift are located in the destination vertical bit vectors. The elements of the destination vertical bit vectors that are in the first position 551-9 are illustrated in hexadecimal form as 0x00,00,00,F0. The elements of destination vertical bit vectors that are in the second position 551-10 are illustrated in hexadecimal form as 0x00,FF,00,F0. The elements of destination vertical bit vectors that are in the third position 551-11 are illustrated in hexadecimal form as 0xFF,FF,00,00. The elements of destination vertical bit vectors that are in the fourth position 551-12 are illustrated in hexadecimal form as 0xFF,00,FF,00.

In FIG. 5D, the elements of the first group of 8 vertical bit vectors, second group of 8 vertical bit vectors, third group of 8 vertical bit vectors, and the first four vertical bit vectors of the fourth group of 8 vertical bit vectors remain in position during the third shift operation due to the vertical shift bit vectors having a value of [0] in the third position 551-7. The last four elements of the fourth group of 8 vertical bit vectors are shifted down four positions (e.g., four rows) due to the corresponding vertical shift bit vectors having a value of [1] in the third position 551-7. Therefore, the elements in the first position (551-9 in FIG. 5C) of the last four elements of the fourth group of 8 vertical bit vectors are shifted to the fourth position 551-12 and are replaced with a value of [0]. The elements in the second position (551-10 in FIG. 5C), the third position (551-11 in FIG. 5C), and the fourth position (551-12 in FIG. 5C) of the last four elements of the fourth group of 8 vertical bit vectors are shifted out of the vertical bit vectors because the vertical bit vector only includes four elements and are replaced with a value of [0].

In a number of embodiments, a four shift operation corresponding to the fourth position 551-8 of the vertical shift bit vectors can be performed. In the example illustrated in FIGS. 5A-5D, the fourth position 551-8 of the vertical shift bit vectors has a binary value of [0] in all positions, therefore each of the elements in the vertical bit vectors remain in their state after the third shift operation FIG. 6 illustrates a table showing the states of memory cells of an array during a shift iteration associated with vertical bit vector shift in accordance with a number of embodiments of the present disclosure. An example shift iteration of a vertical shift operation is described below in association with FIG. 6, which illustrates a table showing the states of memory cells of an array (e.g., array 330) during a shift iteration of a vertical shift operation in accordance with a number of embodiments described herein. The reference numbers of the rows of the tables shown in FIG. 6 correspond to respective steps of the example described below (e.g., row 6611-1 corresponds to a first step of the example, row 661-2 corresponds to a second step of the example, etc.). Each row of the tables indicates the values of a number of bit vectors 633 (Source), 635 (Temp), 637 (Comp_Comp), 639 (Destination) at a particular step of a vertical shift iteration.

The example described in association with FIG. 6 is associated with performing a vertical shift iteration on a particular element of a number of vertical bit vectors stored in a group of memory cells coupled to a particular sense line and to a number of access lines. In a number of embodiments, a shift operation can include performing a shift iteration on each element of a vertical bit vector. For example, first shift operation can include performing a shift iteration on each element of a vertical bit vector for a first element of the vertical shift bit vector (corresponding to a shift of 1 position), a second shift operation can include performing a shift iteration on each element of the vertical bit vector for a second element of the vertical shift bit vector (corresponding to a shift of 2 positions), and a third shift operation can include performing a shift iteration on each element of the vertical bit vector for a third element of the vertical shift bit vector (corresponding to a shift of 4 positions). A vertical shift iteration for a particular element of the vertical shift bit vector can be performed on the results of the previous shift operation. For example, a vertical shift iteration for a second element of the vertical shift bit vector can be performed on the results of a shift operation corresponding to shift iterations for a first element of the vertical shift bit vector. In the example described in association with FIG. 6, the source bit vector 633 (e.g., bit-bit bit vector 0xFF,FF,FF,FF) includes a bit from each of the number of vertical bit vectors that are being shifted during a vertical bit vector shift, which is this example corresponds to a second element of the number of vertical bit vectors.

In this example, the bit-bit vectors Source 633, Temp 635, Comp_Comp 637, and Destination 639 have a length of 32 bits. The result of a shift iteration on a particular element of a number of vertical bit vectors can be stored as a bit-bit vector and/or a data value in a particular group of memory cells (e.g., as Destination bit-bit vector 639). For instance, in the example of FIG. 6, the memory cells corresponding to Destination 639 are used to store the result of the vertical shift iteration (as illustrated by "0xFF,00,FF,00" being stored as the Destination bit-bit vector 639 at row 661-7 which indicates that the second element of the first 8 vertical bit vectors have a logic value of 1 after performing the shift iteration, the second element of the next 8 vertical bit vectors have a logic value of 0 after performing the shift iteration, the second element of the next 8 vertical bit vectors have a logic value of 1 after performing the shift iteration, and the second element of the final 8 vertical bit vectors have a logic value of 0 after performing the shift iteration. The result of the vertical shift iteration can be stored in an array (e.g., stored in cells coupled to access line 304-R in array 330) and/or can be transferred external to the array (e.g., to functional unit circuitry of a host).

The bit vectors 633 (Source), 635 (Temp), 637 (Comp_Comp), and 639 (Destination) can be used in association with performing a vertical shift iteration. The bit-bit vectors 633, 635, 637, and 639 can be stored in respective groups of memory cells coupled to particular access lines, which may be referred to as temporary storage rows (e.g., rows storing data that may be updated during various phases of a bit vector population count determination and may not be accessible to a user).

In the example described in association with FIG. 6, the Source bit-bit vector 633 corresponds to a second element of a number of vertical bit vectors (e.g., the second element of each of the number of vertical bit vectors that the vertical shift iteration is being performed has a logical value of 1).

In a number of examples, a vertical shift iteration includes performing a number of AND operations, OR operations, shift operations, and invert operations. The vertical shift iteration includes performing the AND operations, OR operations, shift operations, and invert operations without transferring data via an input/output (I/O) line to perform a vertical bit vector shift. The number of AND operations, OR operations, invert operations, and shift operations can be performed using sensing circuitry on pitch with each of a number of columns of complementary sense lines.

The pseudo code below represents instructions executable to perform a vertical shift iteration in a memory in accordance with a number of embodiments of the present disclosure. A first portion of the pseudo code can include:

Obtain Temp Rows

The first portion of the pseudo code listed above is associated with initializing a number of groups of memory cells for use as temporary storage rows. Initializing refers to designating and/or assigning particular access lines used to store particular bit-bit vectors for performing the bit vector population count determination. For example, the number of groups of memory cells can be initialized and/or designated groups of cells coupled to respective access lines (e.g., rows) that store data (e.g., on a temporary basis) in association with performing the vertical shift iterations. For example, a first group of memory cells corresponding to a Source 633 bit-bit vector (e.g., the elements of the number vertical bit vectors that are being shifted during the vertical shift iteration) can be coupled to particular access line and can store a bit-bit vector referred to as a "Source" bit vector. A second group of memory cells corresponding to a Temp 635 bit-bit vector can be coupled to a particular access line (e.g., 304-R, illustrated as ROW N) and can store a bit-bit vector referred to as a "Temp" bit-bit vector. A third group of memory cells corresponding to a Comp_Comp 637 bit vector can be coupled to a particular access line and can store a bit vector referred to as a "Comp_Comp" bit vector. A fourth group of memory cells corresponding to a Destination 639 bit-bit vector can be coupled to a particular access line and can store a bit-bit vector referred to as a "Destination" bit vector. Embodiments are not limited to a particular number of temporary storage rows and/or to storage of the corresponding bit vectors on particular access lines. Also, although the groups of memory cells used to store bit-bit vectors may be referred to as "rows," the respective groups of memory cells may comprise fewer than all of the cells coupled to a particular access line. Furthermore, in a number of embodiments, temporary storage rows can refer to access lines which may not be addressable by a user (e.g., access lines that are outside of a user-addressable address space).

A second portion of the pseudo code can be associated with obtaining elements of vertical bit vectors that are shifted during a vertical shift iteration:

```
Load Comp_Comp with Vertical Shift Bit vector
Perform AND operation with Source and Comp_Comp
Load Comp_Comp in Temp
```

The second portion of the pseudo code above illustrates obtaining elements of vertical bit vectors that are shifted during a vertical shift iteration, which are elements of a vertical bit vector that have a corresponding vertical shift bit vector with binary value of 1. Load Comp_Comp with Vertical Shift Bit vector includes loading Comp_Comp with a bit vector that corresponds to an element of the vertical shift bit vector. In this example, the shift iteration is shifting vertical bit vectors according to a second element of the vertical shift bit vector, which corresponds to a shift of two positions in the vertical bit vectors. In FIG. 6, the second element of vertical shift bit vectors corresponds the bolded bit-bit vector 0xFF,00,FF,00 in Comp_Comp 637 at row 661-2. The next step is to Perform AND operation with Source and Comp_Comp. The result of this AND operation is shown by the bolded bit vector 0xFF,00,FF,00 in Comp_Comp 637 at row 661-3. The next step is to Load Comp_Comp in Temp. Comp_Comp stores the result of the AND operation above and this result is then stored in Temp 635, as illustrated by the bolded bit-bit vector 0xFF,00,FF,00 in Temp 635 at row 661-4. The bit vector in Temp will be used during the fourth portion of the pseudo code, which will be described below.

A third portion of the pseudo code can be associated with obtaining elements of vertical bit vectors that remain the same during a vertical shift iteration and includes:

```
Load Comp_Comp with inverse of Vertical Shift Bit vector
Perform AND operation with Destination and Comp_Comp
```

The third portion of the pseudo code above illustrates obtaining elements of vertical bit vectors that are not shifted (e.g., remain the same) during a vertical shift iteration, which are elements of a vertical bit vector that have a corresponding vertical shift bit vector with binary value of 0. Load Comp_Comp with inverse of Vertical Shift Bit vector includes loading Comp_Comp with a bit vector that corresponds to an inverse of an element of the vertical shift bit vector. In this example, the shift iteration is shifting vertical bit vectors according to a second element of the vertical shift bit vector, which corresponds to a shift of two positions in the vertical bit vectors. In FIG. 6, the second element of inverse of vertical shift bit vectors corresponds to the bolded bit vector 0x00,FF,00,FF in Comp_Comp 637 at row 661-5. The next step is to Perform AND operation with Destination and Comp_Comp. The result of this AND operation is shown by the bolded bit vector 0x00,00,00,00 in Comp_Comp 637 at row 661-6.

A fourth portion of the pseudo code can be associated with combining elements of vertical bit vectors that where shifted and elements of the vertical bit vectors that remain the same during a vertical shift iteration:

```
Perform OR operation with Temp and Comp_Comp
Load Comp_Comp in Destination
```

The fourth portion of the pseudo code above illustrates combining elements of vertical bit vectors that where shifted and elements of the vertical bit vectors that remain the same. Perform OR operation with Temp and Comp_Comp combines the elements that were shifted, the elements in Temp, with the elements that were not shifted, the elements in Comp_Comp. The result of the OR operation is shown by the bolded bit vector 0xFF,00,FF,00 in Comp_Comp 637 at row 661-7 The next step is to Load Comp_Comp in Destination is shown by the bolded bit vector 0xFF,00,FF,00 in Comp_Comp 639 at row 661-7. The result of the vertical shift iteration illustrated in FIG. 6 is stored in Destination 639 and row 661-7 and can be used as a source bit vector in further shift iterations.

Figure 7A:
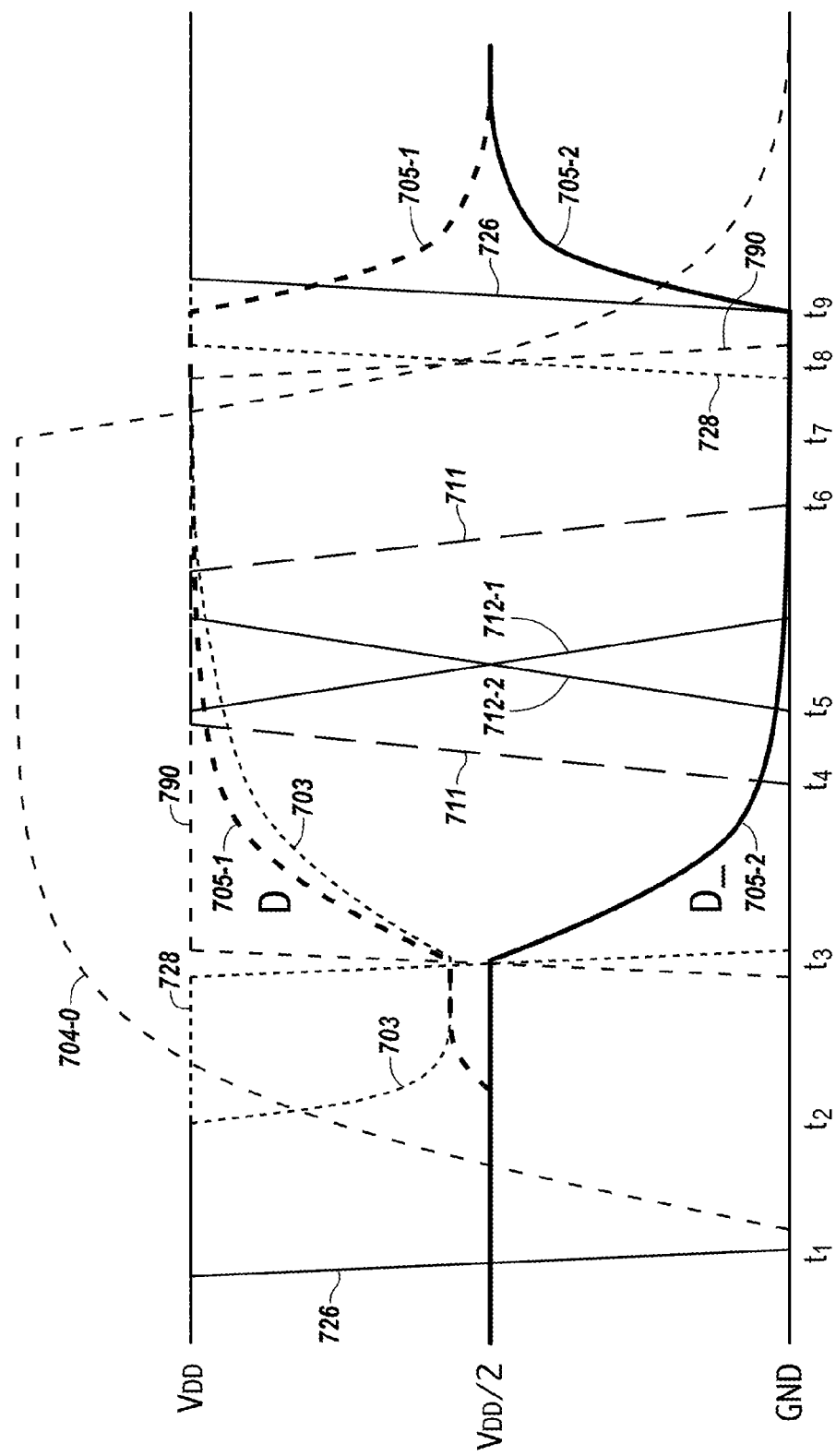
FIGS. 7A-7D illustrate timing diagrams associated with performing a number of logical operations using sensing circuitry in accordance with a number of embodiments of the present disclosure.

FIG. 7A illustrates a timing diagram associated with performing a number of logical operations using sensing circuitry in accordance with a number of embodiments of the present disclosure. The functionality of the sensing circuitry 250 of FIG. 2A is described below with respect to performing logical operations and initially storing a result in the compute component 231 (e.g., secondary latch of the Comp_Compulator). The timing diagram shown in FIG. 7A illustrates signals (e.g., voltage signals) associated with performing a first operation phase of a logical operation (e.g., an R-input logical operation) using the sensing circuitry illustrated in FIG. 2A. The first operation phase described with respect to FIG. 7A can be a first operation phase of an AND, NAND, OR, or NOR operation, for instance. Performing the operation phase illustrated in FIG. 7A can involve consuming significantly less energy (e.g., about half) than previous processing approaches that may involve providing a full swing between voltage rails (e.g., between a supply and ground).

In the example illustrated in FIG. 7a, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the Comp_Compulator. The time references (e.g., $t_1$, etc.) shown in FIG. 7A do not necessarily represent a same absolute or relative time as similar time references in other timing diagrams.

At time $t_1$, the equilibration signal 726 is deactivated, and then a selected row is enabled (e.g., the row corresponding to a memory cell whose data value is to be sensed and used as a first input). Signal 704-0 represents the voltage signal applied to the selected row (e.g., Row Y 204-Y shown in FIG. 2A). When row signal 704-0 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 shown in FIG. 2A if the cell is a 1 T1C DRAM cell), which creates a differential voltage signal between the data lines D and D_ (e.g., as indicated by signals 705-1 and 705-2 on the data lines, respectively) between times $t_2$ and $t_3$. The voltage of the selected cell is represented by signal 703. Due to conservation of energy, creating the differential signal between data lines D and D_ (e.g., by coupling the cell to data line D) does not consume energy, since the energy associated with enabling/disabling the row signal 704-0 can be amortized over the plurality of memory cells coupled to the row.

At time $t_3$, the sense amplifier (e.g., 206 shown in FIG. 2A) is enabled (e.g., a positive control signal 790 (e.g., corresponding to ACT 290 shown in FIG. 2B) goes high and the negative control signal 728 (e.g., corresponding to RnIF 228 shown in FIG. 2B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line DJ, such that the sensed data value is stored in the primary latch of sense amplifier 206. The primary energy consumption occurs in charging the data line D (205-1) from the equilibration voltage $V_{DD}/2$ to the rail voltage $V_{DD}$. FIG. 7A shows, in example, the data line voltages 705-1 and 705-2 that correspond to a logic "1" being on data line D.

According to some embodiments, the primary latch of sense amplifier 206 can be coupled to the complementary data lines D and D_ through respective pass transistors (not shown in FIG. 2A but in a similar configuration as the manner in which latch 264 is coupled to the data lines D and D_ through load/pass transistors 218-1 and 218-2 shown in FIG. 2A). The Passd control signal 711 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 711 applied to control lines coupled to the respective gates of the pass transistors going high). At time $t_5$, the Comp_Compulator positive control signal 712-1 (e.g., Comp_Compb) and the Comp_Compulator positive control signal 712-2 (e.g., Comp_Comp) are activated via respective control lines 212-1 and 212-2 shown in FIG. 2A. As described below, the Comp_Compulator control signals COMP_COMPB 1412-1 and COMP_COMP 712-2 may remain activated for subsequent operation phases. As such, in this example, activating the control signals COMP_COMPB 712-1 and COMP_COMP 712-2 enables the secondary latch (e.g., Comp_Compulator) of compute component 231 shown in FIG. 2A. The sensed data value stored in sense amplifier 206 is transferred (e.g., copied) to the secondary latch, including the dynamic latch and latch 264.

At time $t_6$, the Passd control signal 711 (and the Passdb control signal) goes low thereby turning off the pass transistors (if present). However, since the Comp_Compulator control signals COMP_COMPB 712-1 and COMP_COMP 712-2 remain activated, an Comp_Compulated result is stored (e.g., latched) in the secondary latches (e.g., Comp_Compulator). At time $t_7$, the row signal 704-0 is deactivated, and the array sense amps are disabled at time $t_8$ (e.g., sense amplifier control signals 728 and 790 are deactivated).

At time $t_9$, the data lines D and D_ are equilibrated (e.g., equilibration signal 726 is activated), as illustrated by data line voltage signals 705-1 and 705-2 moving from their respective rail values to the equilibration voltage ($V_{DD}/2$). The equilibration consumes little energy due to the law of conservation of energy. As described above in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 7B:
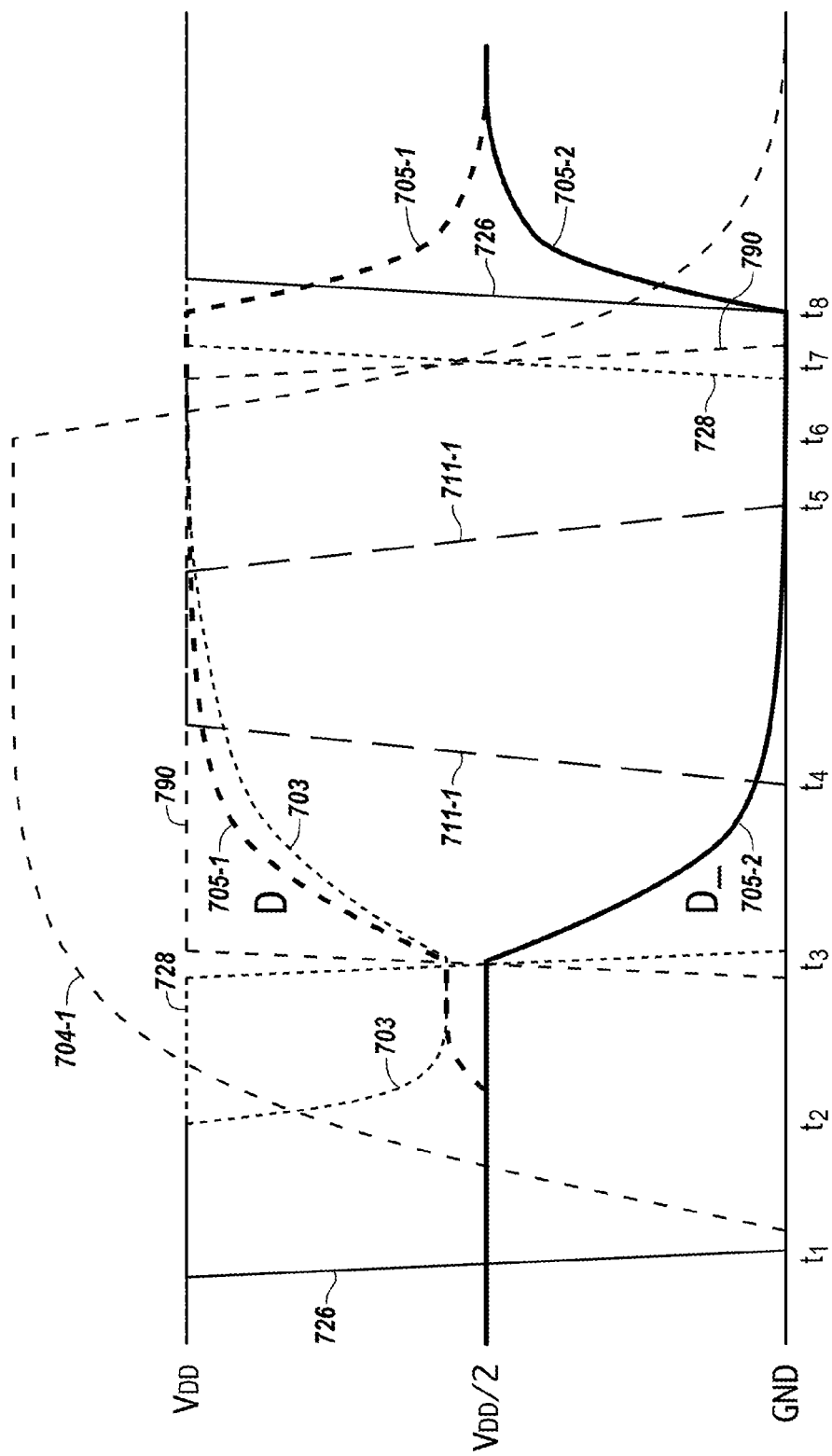
Figure 7C:
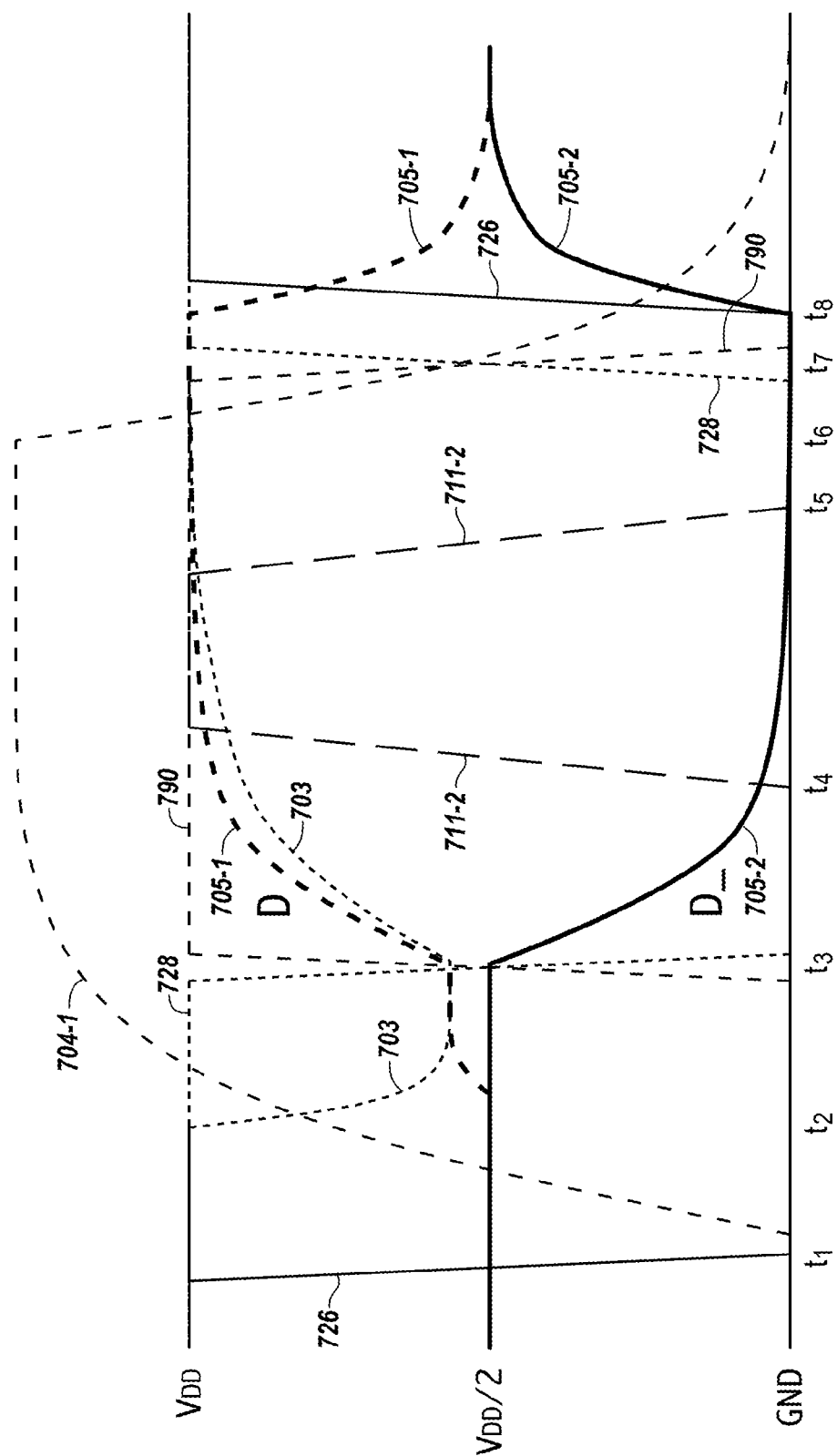

FIGS. 7B and 7C respectively illustrate timing diagrams associated with performing a number of logical operations using sensing circuitry in accordance with a number of embodiments of the present disclosure. Timing diagrams shown in FIGS. 7B and 7C illustrate signals (e.g., voltage signals) associated with performing a number of intermediate operation phases of a logical operation (e.g., an R-input logical operation). For instance, timing diagram shown in FIG. 7B corresponds to a number of intermediate operation phases of an R-input NAND operation or an R-input AND operation, and timing diagram shown in FIG. 7C corresponds to a number of intermediate operation phases of an R-input NOR operation or an R-input OR operation. For example, performing an AND or NAND operation can include performing the operation phase shown in FIG. 7B one or more times subsequent to an initial operation phase such as that described with respect to FIG. 7A. Similarly, performing an OR or NOR operation can include performing the operation phase shown and described with respect to FIG. 7C one or more times subsequent to an initial operation phase such as that described with respect to FIG. 7A.

As shown in the timing diagrams illustrated in FIGS. 7B and 7C, at time $t_1$, equilibration is disabled (e.g., the equilibration signal 726 is deactivated), and then a selected row is enabled (e.g., the row corresponding to a memory cell whose data value is to be sensed and used as an input such as a second input, third input, etc.). Signal 704-1 represents the voltage signal applied to the selected row (e.g., Row Y 204-Y shown in FIG. 2A). When row signal 704-1 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 705-1 and 705-2, respectively) between times $t_2$ and $t_3$. The voltage of the selected cell is represented by signal 703. Due to conservation of energy, creating the differential signal between D and D_ (e.g., by coupling the cell to data line D) does not consume energy, since the energy associated with activating/deactivating the row signal 704-1 can be amortized over the plurality of memory cells coupled to the row.

At time $t_3$, the sense amplifier (e.g., 206 shown in FIG. 2A) is enabled (e.g., a positive control signal 790 (e.g., corresponding to ACT 233 shown in FIG. 2B) goes high, and the negative control signal 728 (e.g., RnIF 228 shown in FIG. 2B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line DJ, such that the sensed data value is stored in the primary latch of sense amplifier 206. The primary energy consumption occurs in charging the data line D (205-1) from the equilibration voltage $V_{DD}/2$ to the rail voltage $V_{DD}$.

As shown in timing diagrams illustrated in FIGS. 7B and 7C, at time $t_4$ (e.g., after the selected cell is sensed), only one of control signals 711-1 (Passd) shown in FIG. 7B and 711-2 (Passdb) shown in FIG. 7C is activated (e.g., only one of pass transistors (if present) is enabled), depending on the particular logic operation. For example, since the timing diagram illustrated in FIG. 7B corresponds to an intermediate phase of a NAND or AND operation, control signal 711-1 (Passd) is activated at time $t_4$ to turn on the pass transistor coupling the primary latch to data line D and the Passdb control signal remains deactivated leaving the pass transistor coupling the primary latch to data line D_ turned off. Conversely, since the timing diagram illustrated in FIG. 7C corresponds to an intermediate phase of a NOR or OR operation, control signal 711-2 (Passdb) is activated at time $t_4$ to turn on the pass transistor coupling the primary latch to data line D_ and control signal Passd remains deactivated leaving the pass transistor coupling the primary latch to data line D turned off. Recall from above that the Comp_Compulator control signals 712-1 (Comp_Compb) and 712-2 (Comp_Comp) were activated during the initial operation phase described with respect to FIG. 7A, and they remain activated during the intermediate operation phase(s).

Since the Comp_Compulator was previously enabled, activating only Passd (711-1 as shown in FIG. 7B) results in Comp_Compulating the data value corresponding to the voltage signal 705-1 shown in FIG. 7B corresponding to data line D. Similarly, activating only Passdb (711-2 as shown in FIG. 7C) results in Comp_Compulating the data value corresponding to the voltage signal 705-2 corresponding to data line D_. For instance, in an example AND/NAND operation shown in the timing diagram illustrated in FIG. 7B in which only Passd (711-1) is activated, if the data value stored in the second selected memory cell is a logic "0," then the Comp_Computed value associated with the secondary latch is asserted low such that the secondary latch stores logic "0." If the data value stored in the second selected memory cell is not a logic "0," then the secondary latch retains its stored first selected memory cell data value (e.g., a logic "1" or a logic "0"). As such, in this AND/NAND operation example, the secondary latch is serving as a zeroes (0s) Comp_Compulator.

Similarly, in an example OR/NOR operation shown in the timing diagram illustrated in FIG. 7C in which only Passdb 711-2 is activated, if the data value stored in the second selected memory cell is a logic "1," then the Comp_Compulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) Comp_Compulator since voltage signal 705-2 on D_ is setting the true data value of the Comp_Compulator.

At the conclusion of an intermediate operation phase such as that shown in FIG. 7B or 7C, the Passd signal 711-1 (e.g., for AND/NAND) or the Passdb signal 711-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 7B or 7C can be repeated in order to Comp_Computate results from a number of additional rows. As an example, the sequence of timing diagram illustrated in FIGS. 7B and/or 7C can be performed a subsequent (e.g., second) time for a third memory cell, a subsequent (e.g., third) time for a fourth memory cell, etc. For instance, for a 10-input NOR operation, the intermediate phase shown in FIG. 7C can occur 9 times to provide 9 inputs of the 10-input logical operation, with the tenth input being determined during the initial operation phase (e.g., as described with respect to FIG. 7A).

Figure 7D:
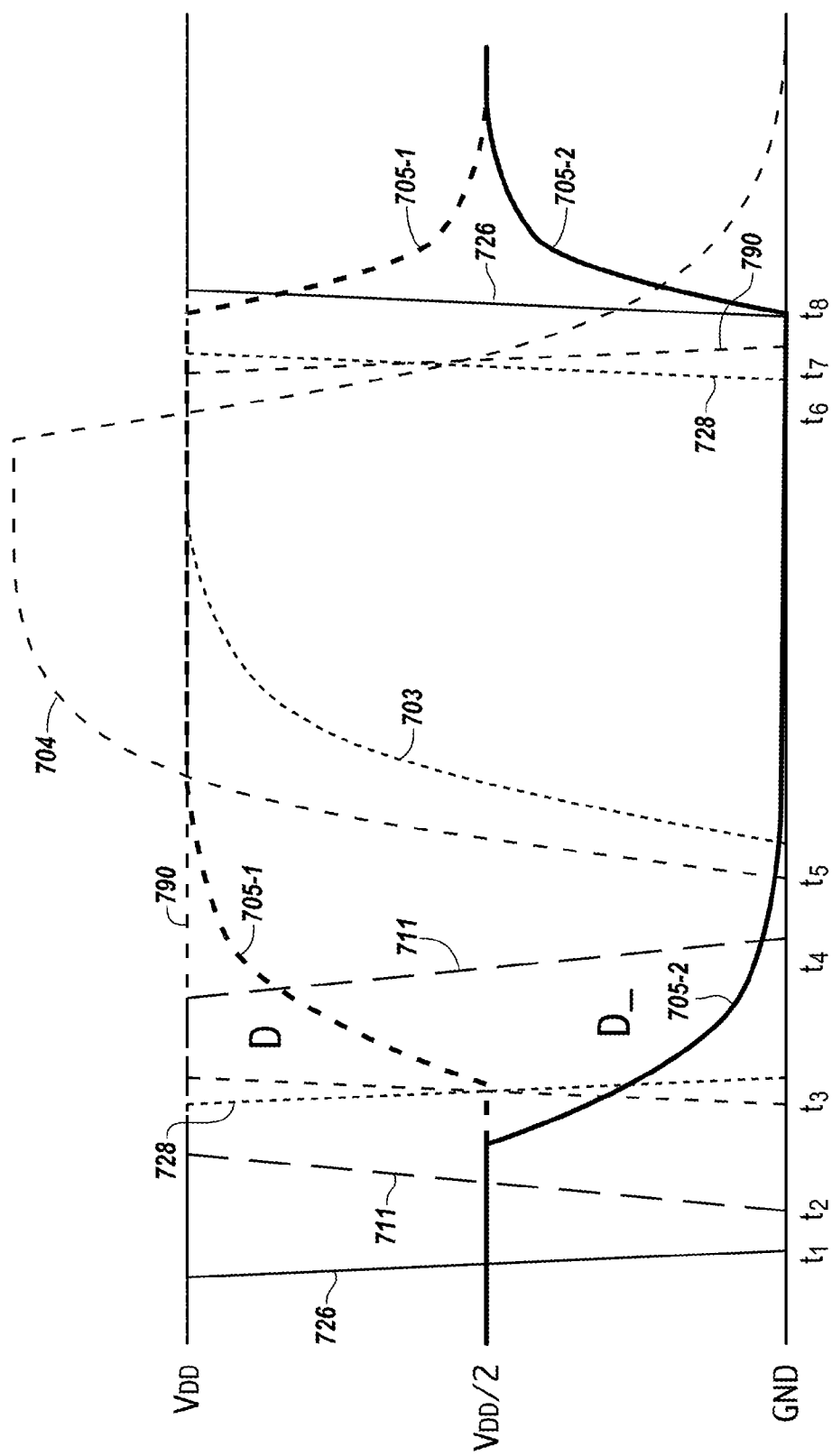

FIG. 7D illustrates a timing diagram associated with performing a number of logical operations using sensing circuitry in accordance with a number of embodiments of the present disclosure. The timing diagram illustrated in FIG. 7D shows signals (e.g., voltage signals) associated with performing a last operation phase of a logical operation (e.g., an R-input logical operation). For instance, the timing diagram illustrated in FIG. 7D corresponds to a last operation phase of an R-input AND operation or an R-input OR operation.

For example, performing a last operation phase of an R-input can include performing the operation phase shown in FIG. 7D subsequent to a number of iterations of the intermediate operation phase(s) described in association with FIGS. 7B and/or 7C. Table 3 shown below indicates the Figures corresponding to the sequence of operation phases associated with performing a number of R-input logical operations in accordance with a number of embodiments described herein.

TABLE 3

| Operation | FIG. 7A | FIG. 7B | FIG. 7C | FIG. 7D |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R−1 iterations for an AND operation in the sense amplifier, then inverting the sense amplifier before conducting the last operation phase to store the result (described below). A NOR operation can be implemented, for example, by storing the result of the R−1 iterations for an OR operation in the sense amplifier, then inverting the sense amplifier before conducting the last operation phase to store the result (described below).

The last operation phase illustrated in the timing diagram of FIG. 7D is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 7D, at time equilibration is disabled (e.g., the equilibration signal 726 is deactivated) such that data lines D and D_ are floating. At time t2, the Passd control signal 711 (and Passdb signal) is activated for an AND or OR operation.

Activating the Passd control signal 711 (and Passdb signal) (e.g., in association with an AND or OR operation) transfers the Comp_Computated output stored in the secondary latch of compute component 231 shown in FIG. 2A to the primary latch of sense amplifier 206. For instance, for an AND operation, if any of the memory cells sensed in the prior operation phases (e.g., the first operation phase illustrated in FIG. 7A and one or more iterations of the intermediate operation phase illustrated in FIG. 7B) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206 is then enabled (e.g., a positive control signal 290 (e.g., corresponding to ACT 290 shown in FIG. 2B) goes high and the negative control signal 728 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 7A and one or more iterations of the intermediate operation phase shown in FIG. 7C) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time $t_3$, the primary latch of sense amplifier 206 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 7D, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 7D show, at time t3, the positive control signal 790 and the negative control signal 728 being deactivated (e.g., signal 790 goes high and signal 728 goes low) to disable the sense amplifier 206 shown in FIG. 2A. At time t4 the Passd control signal 711 (and Passdb signal) that was activated at time t2 is deactivated. Embodiments are not limited to this example. For instance, in a number of embodiments, the sense amplifier 206 shown in FIG. 2A may be enabled subsequent to time t4 (e.g., after he Passd control signal 711 (and Passdb signal) are deactivated).

As shown in FIG. 7D, at time t5, a selected row is enabled (e.g., by row activation signal 704 going high, which drives the capacitor of the selected cell to the voltage corresponding to the logic value stored in the Comp_Compulator. At time t6 the selected row is disabled. At time t7 the sense amplifier 206 shown in FIG. 2A is disabled (e.g., positive control signal 728 and negative control signal 790 are deactivated in FIG. 7D), and at time t8 equilibration occurs (e.g., signal 726 is activated and the voltages on the complementary data lines 705-1 (D) and 705-2 (D_) are brought to the equilibration voltage, as shown in FIG. 7D).

Although the example of performing a last operation phase of an R-input was discussed above with respect to FIG. 7D for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

The functionality of the sensing circuitry 250 of FIG. 2A is described below and summarized in Table 1 below with respect to performing logical operations and initially storing a result in the sense amplifier 206. Initially storing the result of a particular logical operation in the primary latch of sense amplifier 206 can provide improved versatility as compared to previous approaches in which the result may initially reside in a secondary latch (e.g., Comp_Compulator) of a compute component 231, and then be subsequently transferred to the sense amplifier 206, for instance.

TABLE 1

| Operation | Comp_Compulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206 (e.g., without having to perform an additional operation to move the result from the compute component 231 (e.g., Comp_Compulator) to the sense amplifier 206) is advantageous because, for instance, the result can be written to a row (of the array of memory cells) or back into the Comp_Compulator without performing a precharge cycle (e.g., on the complementary data lines 205-1 (D) and/or 205-2 (D_)).

Figure 8A:
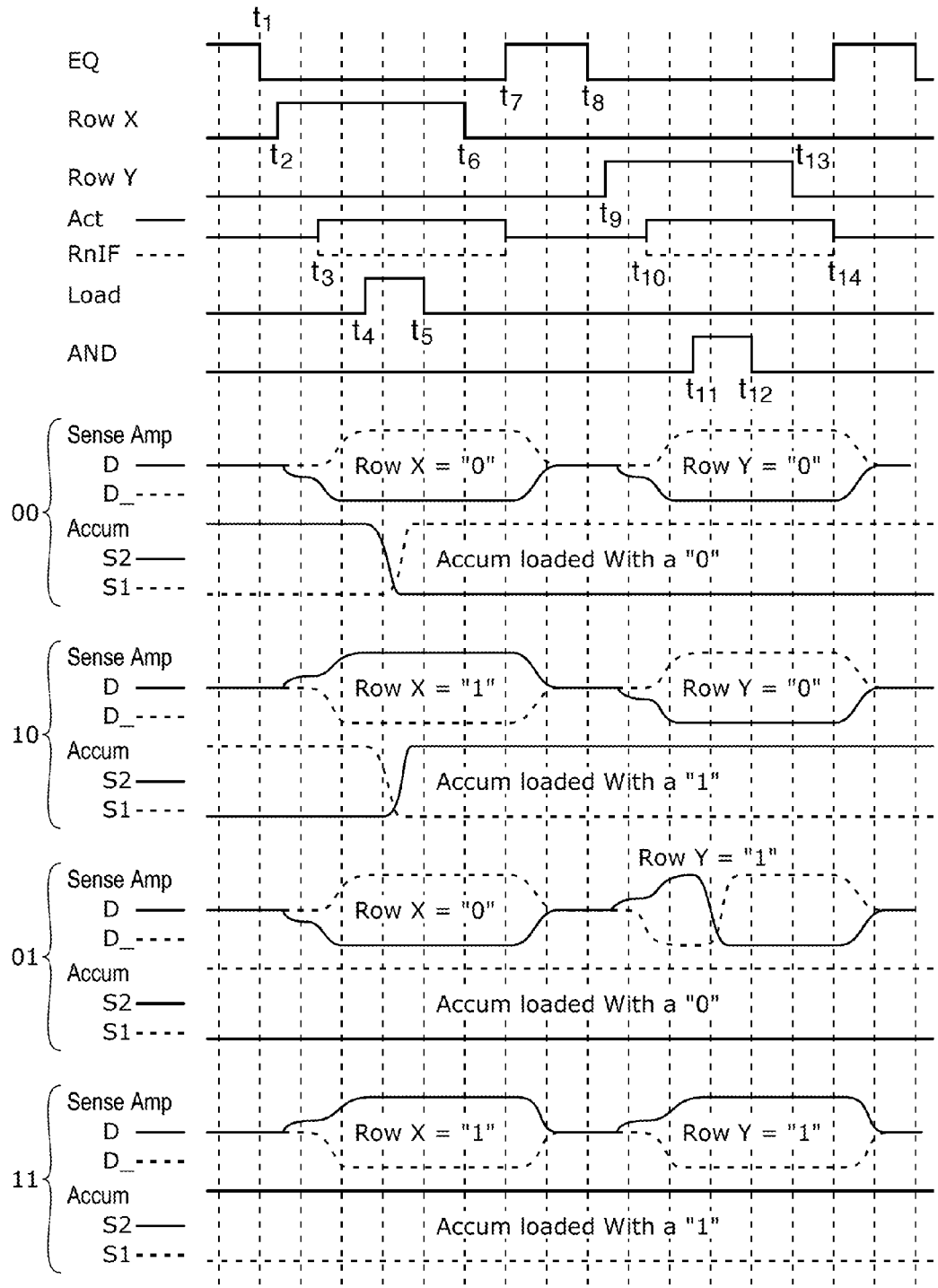
FIGS. 8A-8B illustrate timing diagrams associated with performing a number of logical operations using sensing circuitry in accordance with a number of embodiments of the present disclosure.

FIG. 8A illustrates a timing diagram associated with performing a number of logical operations using sensing circuitry in accordance with a number of embodiments of the present disclosure. FIG. 8A illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 8A illustrates a number of control signals associated with operating sensing circuitry (e.g., 250 in FIG. 2A) to perform the AND logical operation. "EQ" corresponds to an equilibrate signal applied to the sense amp 206, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206, "LOAD" corresponds to a load control signal (e.g., LOAD/PASSD and LOAD/PASSDb shown in FIG. 2A), and "AND" corresponds to the AND control signal shown in FIG. 2A. FIG. 8A also illustrates the waveform diagrams showing the signals (e.g., voltage signals) on the digit lines D and D_corresponding to sense amp 206 and on the nodes S1 and S2 corresponding to the compute component 231 (e.g., Comp_Comp) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the Comp_Compulator can be summarized as follows:

---

Copy Row X into the Comp_Compulator:
    Deactivate EQ
    Open Row X
    Fire Sense Amps (after which Row X data resides in the sense amps)
    Activate LOAD (sense amplifier data (Row X) is transferred to nodes S1 and S2 of the Comp_Compulator and resides there dynamically)
    Deactivate LOAD
    Close Row X
    Precharge

---

In the pseudo code above, "Deactivate EQ" indicates that an equilibration signal (EQ signal shown in FIG. 8A) corresponding to the sense amplifier 206 is disabled at $t_1$ as shown in FIG. 8A (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 8A. When the voltage signal applied to ROW X reaches the threshold voltage (Vt) of the access transistor (e.g., 202-2) corresponding to the selected cell, the access transistor turns on and couples the data line (e.g., 205-2 (D_)) to the selected cell (e.g., to capacitor 203-2) which creates a differential voltage signal between the data lines.

After Row X is enabled, in the pseudo code above, "Fire Sense Amps" indicates that the sense amplifier 206 is enabled to set the primary latch and subsequently disabled. For example, as shown at $t_3$ in FIG. 8A, the ACT positive control signal (e.g., 290 shown in FIG. 2B) goes high and the RnIF negative control signal (e.g., 228 shown in FIG. 2B) goes low, which amplifies the differential signal between 205-1 (D) and D_ 205-2, resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). The sensed data value is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and Comp_Compulator signals illustrated in FIG. 8A (e.g., one for each combination of Row X and Row Y data values) shows the behavior of signals on data lines D and D_. The Row X data value is stored in the primary latch of the sense amp. It should be noted that FIG. 2A shows that the memory cell including storage element 202-2, corresponding to Row X, is coupled to the complementary data line D_, while the memory cell including storage element 202-1, corresponding to Row Y, is coupled to data line D. However, as can be seen in FIG. 2A, the charge stored in memory cell 202-2 (corresponding to Row X) corresponding to a "0" data value causes the voltage on data line D_ (to which memory cell 202-2 is coupled) to go high and the charge stored in memory cell 202-2 corresponding to a "1" data value causes the voltage on data line D_ to go low, which is opposite correspondence between data states and charge stored in memory cell 202-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 8A, causing load/pass transistors 218-1 and 218-2 to conduct. In this manner, activating the LOAD control signal enables the secondary latch in the Comp_Compulator of the compute component 231. The sensed data value stored in the sense amplifier 206 is transferred (e.g., copied) to the secondary latch. As shown for each of the four sets of possible sense amplifier and Comp_Compulator signals illustrated in FIG. 8A, the behavior at inputs of the secondary latch of the Comp_Compulator indicates the secondary latch is loaded with the Row X data value. As shown in FIG. 8A, the secondary latch of the Comp_Compulator may flip (e.g., see Comp_Compulator signals for Row X="0" and Row Y="0" and for Row X="1" and Row Y="0"), or not flip (e.g., see Comp_Compulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_) in FIG. 2A) in the pseudo code above, "Deactivate LOAD" indicates that the LOAD control signal goes back low as shown at $t_5$ in FIG. 8A to cause the load/pass transistors 218-1 and 218-2 to stop conducting and thereby isolate the dynamic latch from the complementary data lines. However, the data value remains dynamically stored in secondary latch of the Comp_Compulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 8A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 8A by the EQ signal going high at $t_7$. As shown in each of the four sets of possible sense amplifier and Comp_Compulator signals illustrated in FIG. 8A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the secondary latch of the compute component 231 shown in FIG. 2A) and the second data value (stored in a memory cell 202-1 coupled to Row Y 204-Y) includes performing particular steps which depend on the whether an AND or an OR is to be performed. Examples of pseudo code associated with "ANDing" and "ORing" the data value residing in the Comp_Compulator (e.g., the first data value stored in the memory cell 202-2 coupled to Row X 204-X) and the second data value (e.g., the data value stored in the memory cell 202-1 coupled to Row Y 204-Y) are summarized below. Example pseudo code associated with "ANDing" the data values can include:

---

Deactivate EQ
Open Row Y
Fire Sense Amps (after which Row Y data resides in the sense amps)
Close Row Y
    The result of the logic operation, in the next operation, will be placed on the sense amp, which will overwrite any row that is active.
        Even when Row Y is closed, the sense amplifier still contains the Row Y data value.
    Activate AND
        This results in the sense amplifier being written to the value of the function (e.g., Row X AND Row Y)
            If the Comp_Compulator contains a "0" (i.e., a voltage corresponding to a "0" on node S2 and a voltage corresponding to a "1" on node S1), the sense amplifier data is written to a "0"
            If the Comp_Compulator contains a "1" (i.e., a voltage corresponding to a "1" on node S2 and a voltage corresponding to a "0" on node S1), the sense amplifier data remains unchanged (Row Y data)
                This operation leaves the data in the Comp_Compulator unchanged.
    Deactivate AND
    Precharge

---

In the pseudo code above, "Deactivate EQ" indicates that an equilibration signal corresponding to the sense amplifier 206 is disabled (e.g., such that the complementary data lines 205-1 (D) and 205-2 (D_) are no longer shorted to $V_{DD}/2$), which is illustrated in FIG. 8A at $t_8$. After equilibration is disabled, a selected row (e.g., ROW Y) is enabled as indicated in the pseudo code above by "Open Row Y" and shown in FIG. 8A at $t_9$. When the voltage signal applied to ROW Y reaches the threshold voltage (Vt) of the access transistor (e.g., 202-1) corresponding to the selected cell, the access transistor turns on and couples the data line (e.g., D_ 205-1) to the selected cell (e.g., to capacitor 203-1) which creates a differential voltage signal between the data lines.

After Row Y is enabled, in the pseudo code above, "Fire Sense Amps" indicates that the sense amplifier 206 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). As shown at $t_{10}$ in FIG. 8A, the ACT positive control signal (e.g., 290 shown in FIG. 2B) goes high and the RnIF negative control signal (e.g., 228 shown in FIG. 2B) goes low to fire the sense amps. The sensed data value from memory cell 202-1 is stored in the primary latch of sense amplifier 206, as previously described. The secondary latch still corresponds to the data value from memory cell 202-2 since the dynamic latch is unchanged.

After the second data value sensed from the memory cell 202-1 coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 8A shows that Row Y is left enabled such that the result of the logical operation can be stored back in the memory cell corresponding to Row Y. Isolating the memory cell corresponding to Row Y can be accomplished by the access transistor turning off to decouple the selected cell 202-1 from the data line 205-1 (D). After the selected Row Y is configured (e.g., to isolate the memory cell or not isolate the memory cell), "Activate AND" in the pseudo code above indicates that the AND control signal goes high as shown in FIG. 8A at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the Comp_Computator 231 and the second data value (e.g., Row Y) stored in the sense amplifier 206, if the dynamic latch of the compute component 231 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the Comp_Compulator unchanged (e.g., from Row X).

If the secondary latch of the Comp_Compulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 250 is configured such that if the dynamic latch of the Comp_Compulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., Row Y data value so the AND operation result is a "1" if the Row Y data value is a "1" and the AND operation result is a "0" if the Row Y data value is a "0"). This operation leaves the data value in the Comp_Computator unchanged (e.g., from Row X).

After the result of the AND operation is initially stored in the sense amplifier 206, "Deactivate AND" in the pseudo code above indicates that the AND control signal goes low as shown at $t_{12}$ in FIG. 8A, causing pass transistor 207-1 to stop conducting to isolate the sense amplifier 206 (and data line 205-1 (D)) from ground. If not previously done, Row Y can be closed (as shown at $t_{13}$ in FIG. 8A) and the sense amplifier can be disabled (as shown at $t_{14}$ in FIG. 8A by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 8A).

FIG. 8A shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S1 of the secondary latch of the compute component (e.g., 231 shown in FIG. 2A) for an AND logical operation involving each of the possible combination of operands (e.g., Row X/Row Y data values 00, 10, 01, and 11).

Although the timing diagrams illustrated in FIG. 8A and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 8B:
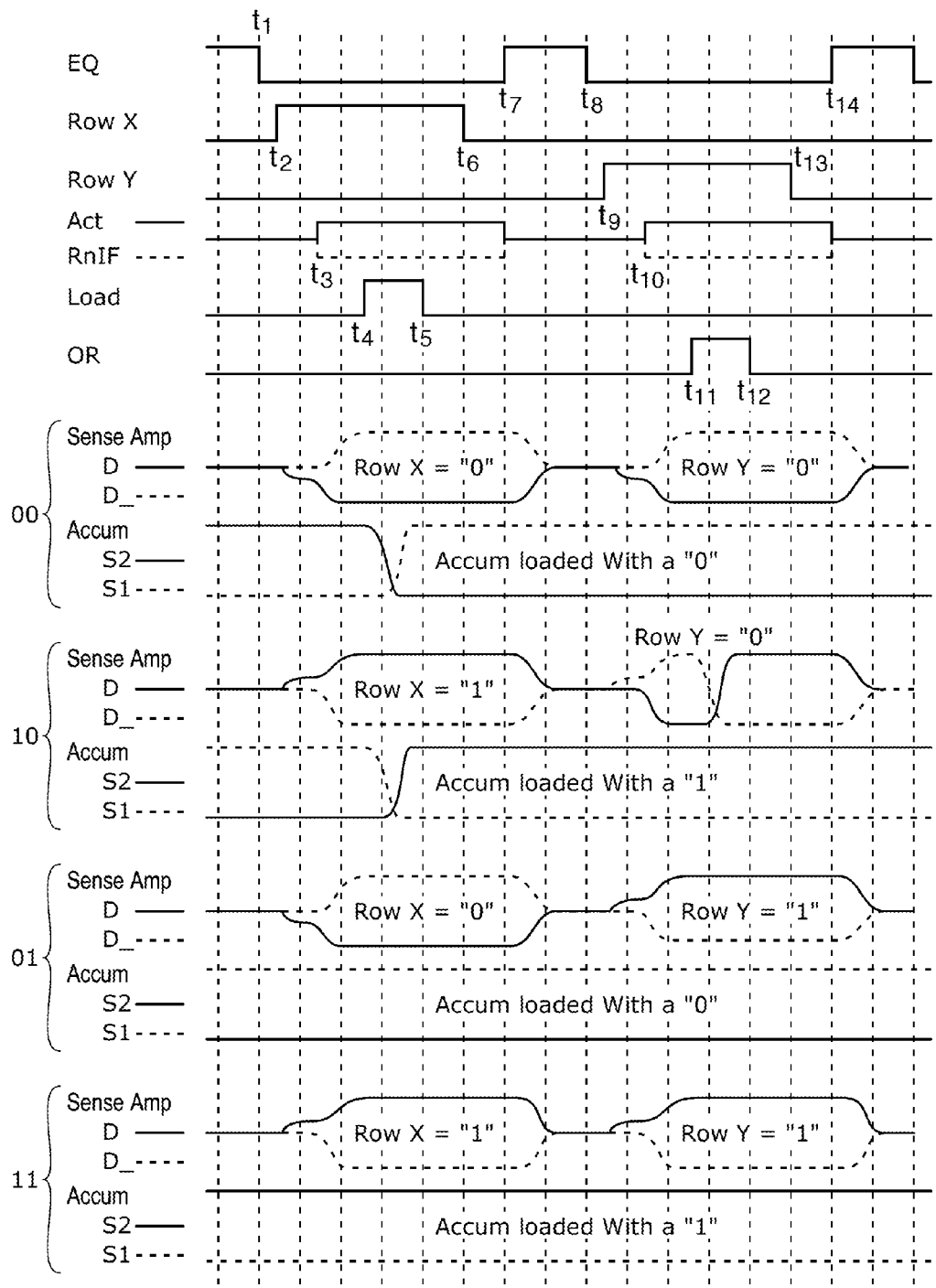

FIG. 8B illustrates a timing diagram associated with performing a number of logical operations using sensing circuitry in accordance with a number of embodiments of the present disclosure. FIG. 8B illustrates a timing diagram associated with initiating an OR logical operation after starting to load the second operand (e.g., Row Y data value) into the sense amplifier. FIG. 8B illustrates the sense amplifier and Comp_Compulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206 and the secondary latch of the compute component 231) and the second data value (stored in a memory cell 202-1 coupled to Row Y 204-Y). The operations to load the Row X data into the sense amplifier and Comp_Compulator that were previously described with respect to times $t_1$-$t_7$ shown in FIG. 8A are not repeated with respect to FIG. 8B. Example pseudo code associated with "ORing" the data values can include:

---
Deactivate EQ
Open Row Y
Fire Sense Amps (after which Row Y data resides in the sense amps)
Close Row Y
    When Row Y is closed, the sense amplifier still contains
the Row Y data value.
    Activate OR
        This results in the sense amplifier being written to the
value of the function (e.g., Row X OR Row Y), which may overwrite the
data value from Row Y previously stored in the sense amplifier as follows:
        If the Comp_Compulator contains a "0" (i.e., a voltage
corresponding to a "0" on node S2 and a voltage corresponding to a "1"
on node S1), the sense amplifier data remains unchanged (Row Y data)
        If the Comp_Compulator contains a "1" (i.e., a voltage
corresponding to a "1" on node S2 and a voltage corresponding to a "0"
on node S1), the sense amplifier data is written to a "1"
            This operation leaves the data in the Comp_Compulator
unchanged.
    Deactivate OR
    Precharge
---

The "Deactivate EQ" (shown at $t_8$ in FIG. 8B), "Open Row Y" (shown at $t_9$ in FIG. 8B), "Fire Sense Amps" (shown at $t_{10}$ in FIG. 8B), and "Close Row Y" (shown at $t_{13}$ in FIG. 8B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 8B, which causes pass transistor 207-2 to conduct. In this manner, activating the OR control signal causes the value of the function (e.g., Row X OR Row Y) to be written to the sense amp.

With the first data value (e.g., Row X) stored in the secondary latch of the compute component 231 and the second data value (e.g., Row Y) stored in the sense amplifier 206, if the dynamic latch of the Comp_Computator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 250 is configured such that if the dynamic latch of the Comp_Computator contains a "0," with the voltage corresponding to a "0" on node S2, transistor 209-2 is off and does not conduct (and pass transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the Comp_Computator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206 as a result of the OR operation when the secondary latch of the Comp_Computator contains a "1" regardless of the data value previously stored in the sense amp. This operation leaves the data in the Comp_Computator unchanged. FIG. 8B shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component 231 for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at $t_{12}$ in FIG. 8B, causing pass transistor 207-2 to stop conducting to isolate the sense amplifier 206 (and data line D 205-2) from ground. If not previously done, Row Y can be closed (as shown at $t_{13}$ in FIG. 8B) and the sense amplifier can be disabled (as shown at $t_{14}$ in FIG. 4 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 8B.

The sensing circuitry 250 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-1 to conduct and activating the ANDinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or compliment version of one data value can be used in the Comp_Computator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the Comp_Computator and using that data to invert the data value in the sense amplifier 206. As previously mentioned, activating the ORinv control signal causes transistor 214-1 to conduct and activating the ANDinv control signal causes transistor 214-2 to conduct. The ORinv and/or ANDinv control signals are used in implementing the NOT function, as described further below:

```
Copy Row X into the Comp_Computator
    Deactivate EQ
    Open Row X
    Fire Sense Amps (after which Row X data resides in the
    sense amps)
        Activate LOAD (sense amplifier data (Row X) is
    transferred to nodes S1 and S2 of the Comp_Computator and
    resides there dynamically
        Deactivate LOAD
        Activate ANDinv and ORinv (which puts the compliment
data value on the data lines)
This results in the data value in the sense amplifier being inverted (e.g.,
the sense amplifier latch is flipped)
            This operation leaves the data in the
Comp_Computator unchanged
        Deactivate ANDinv and ORinv
        Close Row X
        Precharge
```

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Comp_Computator" initial operation phase described above prior to pseudo code for the AND operation and OR operation. However, rather than closing the Row X and Precharging after the Row X data is loaded into the sense amplifier 206 and copied into the dynamic latch, a compliment version of the data value in the dynamic latch of the Comp_Computator can be placed on the data line and thus transferred to the sense amplifier 206 by enabling (e.g., causing transistor to conduct) and disabling the invert transistors (e.g., ANDinv and ORinv). This results in the sense amplifier 206 being flipped from the true data value that was previously stored in the sense amplifier to a compliment data value (e.g., inverted data value) stored in the sense amp. For example, a true or compliment version of the data value in the Comp_Computator can be transferred to the sense amplifier by activating and deactivating ANDinv and ORinv. This operation leaves the data in the Comp_Computator unchanged.

Because the sensing circuitry 250 shown in FIG. 2A initially stores the result of the AND, OR, and NOT logical operations in the sense amplifier 206 (e.g., on the sense amplifier nodes), these logical operation results can be communicated easily and quickly to any enabled row, any row activated after the logical operation is complete, and/or into the secondary latch of the compute component 231. The sense amplifier 206 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the Comp_Computator to reduce overall current utilized because the sense amps 206 are not at full rail voltages (e.g., supply voltage or ground/reference voltage) when Comp_Computator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the Comp_Computator. Operations to shift right Row X can be summarized as follows:

```
Deactivate Norm and Activate Shift
Deactivate EQ
Open Row X
Fire Sense Amps (after which shifted Row X data resides in the sense
amps)
Activate Norm and Deactivate Shift
Close Row X
Precharge
```

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Comp_Compulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

---

Activate Norm and Deactivate Shift
Deactivate EQ
Open Row X
Fire Sense Amps (after which Row X data resides in the sense amps)
Deactivate Norm and Activate Shift
    Sense amplifier data (shifted left Row X) is transferred to Row X
Close Row X
Precharge

---

In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Comp_Compulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDS or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred there between. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for shifting data, comprising:
    shifting elements of bit vectors stored in a memory array by:
        performing shift operations, wherein each of the shift operations shift elements of the bit vectors by a number of positions indicated by a vertical shift bit vector; and
        wherein each bit vector is stored in memory cells coupled to a sense line and a plurality of access lines; and each bit vector is separated by at least one sense line from a neighboring bit vector.

2. The method claim 1, including storing the vertical shift bit vector in memory cells that are coupled the sense line that is coupled to memory cells storing a corresponding bit vector.

3. The method of claim 1, wherein performing the shift operations includes shifting elements of each of the bit vectors that are coupled to a common access line by an amount indicated by the vertical shift bit vector.

4. The method of claim 1, wherein performing the shift operations includes performing a shift iteration on each element of each of the bit vectors that are coupled to a common access line by an amount indicated by elements of the vertical shift bit vector.

5. The method claim 1, performing the shift operations includes performing a first AND operation with an element of the vertical shift bit vector and an element of the bit vector that is being shifted.

6. The method of claim 1, wherein performing the shift operations includes performing at least one of an AND, an OR, an invert, and a shift operation, wherein the at least one of the AND, OR, invert, and shift operations is based on a value of elements in the vertical shift bit vector.

7. The method of claim 1, wherein performing the shift operations includes shifting an element of the bit vectors by $2^{n-1}$ positions as indicated by elements of the vertical shift bit vector that are coupled to a common access line and wherein n corresponds to an element's position in the vertical shift bit vector.

8. The method of claim 1, wherein the method includes storing a bit vector for each of the shift operations in memory cells coupled an access line that is different than the plurality of access lines coupled to the memory cells storing the bit vectors.

9. An apparatus comprising:
    a first group of memory cells coupled to a sense line and a first plurality of access lines and configured to store a number of elements of a vertical bit vector; and
    a controller configured to cause:
        the number of elements of the vertical bit vector to shift by a number of positions indicated by a vertical shift bit vector, wherein elements of the vertical shift bit vector having a first value indicate that the elements of the vertical bit vector are not shifted and elements of the vertical shift bit vector having a second value indicate that elements of the vertical bit vector are to be shifted by an amount corresponding to a position of the element in the vertical shift bit vector.

10. The apparatus of claim 9, wherein the vertical shift bit vector is stored in a second group of memory cells coupled to the sense line and a second plurality of access lines.

11. The apparatus of claim 9, wherein the controller is configured to cause a shifted vertical bit vector to be stored in a third group of memory cells coupled to the sense line and a third plurality of access lines.

12. The apparatus of claim 9, wherein the vertical shift bit vector includes a number of elements and each element of the vertical shift bit vector corresponds to an amount to shift the number of elements of the vertical bit vector.

13. The apparatus of claim 12, wherein the amount of shift for the number of elements of the vertical shift bit vector corresponds to $2^{n-1}$ positions, wherein n corresponds to an element's position in the vertical shift bit vector.

14. A method for shifting data, comprising:
    shifting elements of bit vectors stored in a memory array by:
        performing shift operations, wherein each of the shift operations shift elements of the bit vectors by a number of positions indicated by a vertical shift bit vector, wherein an element of the vertical shift bit vector indicates that a bit of the bit vectors is shifted by $2^{n-1}$ positions, and wherein n corresponds to an element's position in the vertical shift bit vector; and
        wherein each bit vector is stored in memory cells coupled to a sense line and a plurality of access lines; and each bit vector is separated by at least one sense line from a neighboring bit vector.

15. The method claim 14, wherein the vertical shift bit vector is stored in memory cells that are coupled the sense line that is coupled to memory cells storing a corresponding one of the bit vectors.

16. The method of claim 14, wherein performing the shift operations includes shifting elements of each of the bit vectors that are coupled to a common access line by an amount indicated by the vertical shift bit vector.

17. The method of claim 14, wherein performing the shift operations includes performing a shift iteration on each element of each of the bit vectors that are coupled to a common access line by an amount indicated by elements of the vertical shift bit vector.

18. The method claim 17, wherein performing the shift iteration includes inverting an element of the vertical shift bit vector, performing an AND operation with the inverted element of the vertical shift bit vector and an element of the bit vectors, and storing the result of the AND operation in destination memory cells corresponding to the element of the bit vectors.

19. The method of claim 17, wherein performing the shift iteration includes performing a first AND operation with a first element of the vertical shift bit vector and a first element of the bit vectors that is being shifted, inverting the first element of the vertical shift bit vector, performing a second AND operation with the inverted element of the vertical shift bit vector and the first element of the bit corresponding to a shifted bit vector, performing an OR operation on the result of the first AND operation and the second AND operation, and storing a result of the OR operation in destination memory cells.

20. The method of claim 14, wherein the method includes storing a bit vector for each of the shift operations in memory cells coupled an access line that is different than the plurality of access lines coupled to the memory cells storing the bit vectors.

* * * * *